United States Patent
Harada et al.

(10) Patent No.: US 12,233,465 B1
(45) Date of Patent: Feb. 25, 2025

(54) CUTTING TOOL

(71) Applicant: Sumitomo Electric Industries, Ltd., Osaka (JP)

(72) Inventors: Haruko Harada, Osaka (JP); Fumiyoshi Kobayashi, Osaka (JP); Anongsack Paseuth, Osaka (JP); Kosuke Tominaga, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/725,168

(22) PCT Filed: Jan. 23, 2024

(86) PCT No.: PCT/JP2024/001831
§ 371 (c)(1),
(2) Date: Jun. 28, 2024

(51) Int. Cl.
*B23B 27/14* (2006.01)
*C23C 16/34* (2006.01)
*C23C 16/40* (2006.01)

(52) U.S. Cl.
CPC ............ *B23B 27/148* (2013.01); *C23C 16/34* (2013.01); *C23C 16/403* (2013.01); *B23B 2228/105* (2013.01)

(58) Field of Classification Search
CPC ............ B32B 27/148; B32B 2228/105; C23C 16/403
See application file for complete search history.

(56) References Cited

U.S. PATENT DOCUMENTS

| | | |
|---|---|---|
| 2017/0190591 A1 | 7/2017 | Imamura et al. |
| 2019/0003060 A1 | 1/2019 | Okude et al. |
| 2022/0040767 A1* | 2/2022 | Okuno ............... C23C 14/06 |

FOREIGN PATENT DOCUMENTS

| | | |
|---|---|---|
| JP | 2022-015073 A | 1/2022 |
| WO | 2015/114049 A1 | 8/2015 |
| WO | 2016/208663 A1 | 12/2016 |
| WO | 2017/037796 A1 | 3/2017 |
| WO | 2020/170570 A1 | 8/2020 |

OTHER PUBLICATIONS

International Search Report and Written Opinion mailed on Mar. 12, 2024, received for PCT Application PCT/JP2024/001831, filed on Jan. 23, 2024, 13 pages including English Translation.
S. Ruppi, "Influence of Process Conditions on the Growth and Texture of CVD Alpha-Alumina", vol. 10, No. 158, Feb. 9, 2020, pp. 1-19.

* cited by examiner

*Primary Examiner* — Maria V Ewald
*Assistant Examiner* — Donald M Flores, Jr.
(74) *Attorney, Agent, or Firm* — XSENSUS LLP

(57) ABSTRACT

A cutting tool is a cutting tool including: a base; and a coating disposed on the base, wherein the coating includes a first layer, wherein the first layer is composed of $\alpha$-$Al_2O_3$, a thickness of the first layer is 2 μm or more and 15 μm or less, on a cross section along a normal line of an interface between the base and the coating, a ratio N2/N1 is 0.60 or more, and on the cross section along the normal line of the interface between the base and the coating, a ratio N4/N3 and the ratio N2/N1 satisfy a relationship of a Formula 1.

6 Claims, 4 Drawing Sheets

CUTTING TOOL

CROSS-REFERENCE TO RELATED APPLICATION

This application is a national stage application, filed under 35 U.S.C. § 371, of International Patent Application No. PCT/JP2024/001831, filed Jan. 23, 2024, the entire contents of which are incorporated herein by reference.

TECHNICAL FIELD

The present disclosure relates to a cutting tool.

BACKGROUND ART

Conventionally used for cutting process is a cutting tool that has a base and a coating disposed on the base, wherein the coating includes a first layer, and the first layer is composed of $\alpha\text{-Al}_2\text{O}_3$ (PTL 1 and NPL 1).

CITATION LIST

Patent Literature

PTL 1: WO 2015/114049

Non Patent Literature

NPL 1: S. Ruppi et al., "influence of Process Conditions on the Growth and Texture of CVD Alpha-Alumina" Coatings 2020, 10, 158.

SUMMARY OF INVENTION

A cutting tool of the present disclosure is a cutting tool comprising.
a base; and
a coating disposed on the base, wherein
the coating includes a first layer, wherein
the first layer is composed of $\alpha\text{-Al}_2\text{O}_3$,
a thickness of the first layer is 2 μm or more and 15 μm or less,
on a cross section along a normal line of an interface between the base and the coating, a ratio N2/N1 is 0.60 or more, wherein the ratio N2/N1 is a ratio of: a number N2 of second grain boundaries that are grain boundaries with an absolute value of an angle relative to a straight line perpendicular to an imaginary line L1 of 15° or less at a position where a first grain boundary and imaginary line L1 intersect in the first grain boundaries; relative to a number N1 of the first grain boundaries through which imaginary line L1 crosses, wherein imaginary line L1 has the same distances from a surface of the first layer or an interface, on a surface side of the coating, of the first layer and from an interface, on a side of the base, of the first layer, and
on the cross section along the normal line of the interface between the base and the coating, a ratio N4/N3 and the ratio N2/N1 satisfy a relationship of a following Formula 1, wherein the ratio N4/N3 is a ratio of: a number N4 of fourth grain boundaries that are grain boundaries with an absolute value of an angle relative to a straight line perpendicular to an imaginary line L2 of 15° or less at a position where a third grain boundary and imaginary line L2 intersect in the third grain boundaries; relative to a number N3 of the third grain boundaries through which imaginary line L2 crosses, wherein imaginary line L2 has a distance of 0.5 μm from the surface of the first layer or the interface, on the surface side of the coating, of the first layer toward a side of the base, $$0.1 \le (N2/N1)-(N4/N3) \le 0.40 \qquad \text{Formula 1.}$$

DETAILED DESCRIPTION

Figure 1:
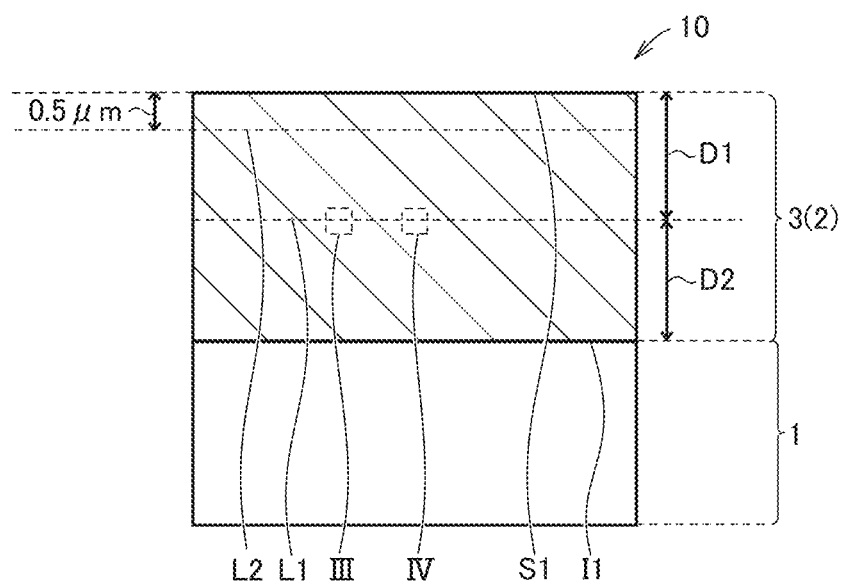
FIG. 1 is a schematic cross-sectional view that exemplifies an aspect of a cutting tool of the present disclosure.

Problem to be Solved by the Present Disclosure

In recent years, requirement for improving a tool lifetime has further increased. One important factor for improving the tool lifetime is "chipping resistance". The "chipping resistance" of a coating can be improved by performing a blast treatment on a surface of the coating. However, when the blast treatment is performed for a purpose of imparting excellent "chipping resistance," it may be difficult to impart excellent "chipping resistance" to the coating due to generation of peeling of the coating. In addition, it may be difficult to impart excellent "chipping resistance" to the coating because the blast treatment is difficult to be performed at a high pressure due to, in a coating that includes an $\alpha\text{-Al}_2\text{O}_3$ layer, breakage that may easily occur at an edge portion of a crystal on a surface side of the coating of the $\alpha\text{-Al}_2\text{O}_3$ layer if the blast treatment is performed at the high pressure for a purpose of imparting excellent "chipping resistance". It has been required to impart excellent tool lifetime to the cutting tool by imparting excellent "chipping resistance" to the coating.

Accordingly, an object of the present disclosure is to provide a cutting tool that has excellent tool lifetime.

Advantageous Effect of the Present Disclosure

According to the present disclosure, the cutting tool that has excellent tool lifetime can be provided.

Description of Embodiments

First, aspects of the present disclosure will be listed and described.

(1) A cutting tool of the present disclosure is a cutting tool comprising:
a base; and
a coating disposed on the base, wherein
the coating includes a first layer, wherein
the first layer is composed of $\alpha\text{-Al}_2\text{O}_3$,
a thickness of the first layer is 2 μm or more and 15 μm or less,
on a cross section along a normal line of an interface between the base and the coating, a ratio N2/N1 is 0.60 or more, wherein the ratio N2/N1 is a ratio of: a number N2 of second grain boundaries that are grain boundaries with an absolute value of an angle relative to a straight line perpendicular to an imaginary line L1 of 15° or less at a position where a first grain boundary and imaginary line L1 intersect in the first grain boundaries; relative to a number N1 of the first grain boundaries through which imaginary line L1 crosses, wherein imaginary line L1 has the same distances from a surface of the first layer or an interface, on a surface side of the coating, of the first layer and from an interface, on a side of the base, of the first layer, and on the cross section along the normal line of the interface between the base and the coating, a ratio N4/N3 and the ratio N2/N1 satisfy a relationship of a following Formula 1, wherein the ratio N4/N3 is a ratio of: a number N4 of fourth grain boundaries that are grain boundaries with an absolute value of an angle relative to a straight line perpendicular to an imaginary line L2 of 15° or less at a position where a third grain boundary and imaginary line L2 intersect in the third grain boundaries; relative to a number N3 of the third grain boundaries through which imaginary line L2 crosses, wherein imaginary line L2 has a distance of 0.5 μm from the surface of the first layer or the interface, on the surface side of the coating, of the first layer toward a side of the base, $$0.1 \leq (N2/N1) - (N4/N3) \leq 0.40 \quad \text{Formula 1.}$$

According to the present disclosure, the cutting tool that has excellent tool lifetime can be provided.

(2) According to the (1), the number N3 and a number N5 of fifth grain boundaries that are grain boundaries with an absolute value of an angle relative to a straight line perpendicular to imaginary line L2 of 45° or less at a position where the third grain boundary and imaginary line L2 intersect in the third grain boundaries may satisfy a relationship of a following Formula 2, $$(N5/N3) > 0.96 \quad \text{Formula 2.}$$

According to this, the cutting tool that has more excellent tool lifetime can be provided.

(3) According to the (1) or (2),
the thickness of the first layer may be less than 8 μm, and on the surface of the first layer or on a surface positioned on an interface, on the surface side of the coating, of the first layer, a surface roughness Ra may be 0.03 μm or more and 0.2 μm or less. According to this, the cutting tool that has more excellent tool lifetime can be provided (4) According to the (1) or (2),
the thickness of the first layer may be 8 μm or more, and on the surface of the first layer or on a surface positioned on an interface, on the surface side of the coating, of the first layer, a surface roughness Ra may be 0.05 μm or more and 0.2 μm or less. According to this, the cutting tool that has more excellent tool lifetime can be provided.

(5) According to any one of the (1) to (4), an absolute value of a compressive residual stress of the first layer may be 1.5 GPa or more and 4.0 GPa or less. According to this, the cutting tool that has more excellent tool lifetime can be provided.

(6) According to any one of the (1) to (5), an orientation index TC (0 0 12) of the first layer may be more than 4.5. According to this, the cutting tool that has more excellent tool lifetime can be provided.

Detail of Embodiments of the Present Disclosure

With reference to the drawings, specific examples of the cutting tool of an embodiment of the present disclosure (hereinafter, also referred to as "the present embodiment") will be described hereinafter. In the drawings of the present disclosure, a same reference sign represents same parts or corresponding parts. Dimensions such as length, width, thickness, and depth are appropriately modified to clarify and simplify the drawings, and do not always represent actual dimensions.

A description in the form of "A to B" herein means an upper and lower limits of a range (that is, A or more and B or less). When A has no description of a unit and only B has a description of a unit, the unit of A and the unit of B are same.

When a compound and the like are represented by a chemical formula herein, any conventionally known atomic ratios are included unless the atomic ratio is particularly limited, and should not be necessarily limited to an atomic ratio within a stoichiometric range.

Embodiment 1: Cutting Tool

Figure 3:
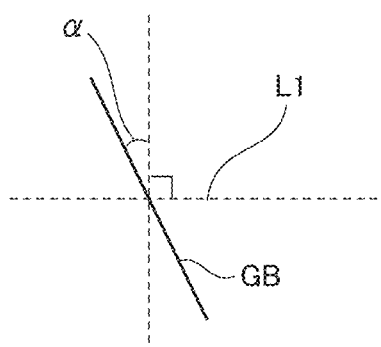
FIG. 3 is an enlarged view in a region III in FIG. 1 and FIG. 5.
Figure 4:
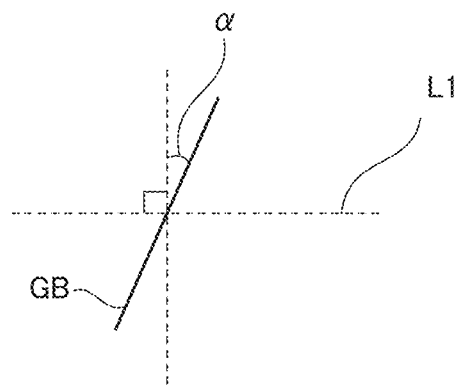
FIG. 4 is an enlarged view in a region IV in FIG. 1 and FIG. 5.
Figure 5:
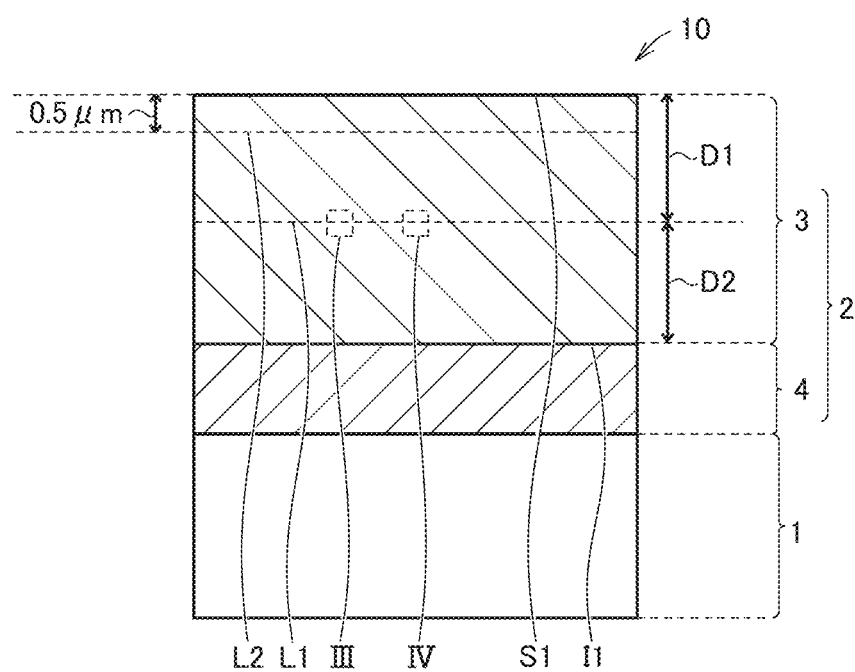
FIG. 5 is a schematic cross-sectional view that exemplifies another aspect of a cutting tool of the present disclosure.

The cutting tool according to an embodiment of the present disclosure will be described by using FIG. 1 and FIG. 3 to FIG. 5. FIG. 1 is a schematic cross-sectional view that exemplifies an aspect of the cutting tool of the present disclosure. FIG. 3 is an enlarged view in a region Ill in FIG. 1 and FIG. 5. FIG. 4 is an enlarged view in a region IV in FIG. 1 and FIG. 5. FIG. 5 is a schematic cross-sectional view that exemplifies another aspect of the cutting tool of the present disclosure.

An embodiment of the present disclosure (hereinafter, also referred to as "the present embodiment") is a cutting tool 10 comprising:
a base 1; and
a coating 2 disposed on base 1, wherein
coating 2 includes a first layer 3, wherein
first layer 3 is composed of $\alpha\text{-}Al_2O_3$,
a thickness of first layer 3 is 2 μm or more and 15 μm or less,
on a cross section along a normal line of an interface between base 1 and coating 2, a ratio N2/N1 is 0.60 or more, wherein the ratio N2/N1 is a ratio of: a number N2 of second grain boundaries that are grain boundaries with an absolute value of an angle relative to a straight line perpendicular to an imaginary line L1 of 15° or less at a position where a first grain boundary and imaginary line L1 intersect in the first grain botndaries; relative to a number N1 of the first grain boundaries through which imaginary line L1 crosses, wherein imaginary line L1 has the same distances from a surface S1 of first layer 3 or an interface, on a surface side of coating 2, of first layer 3 and from an interface I1, on a side of base 1, of first layer 3, and
on the cross section along the normal line of the interface between base 1 and coating 2, a ratio N4/N3 and the ratio N2/N1 satisfy a relationship of the following Formula 1, wherein the ratio N4/N3 is a ratio of: a number N4 of fourth grain boundaries that are grain boundaries with an absolute value of an angle relative to a straight line perpendicular to an imaginary line L2 of 15° or less at a position where a third grain boundary and imaginary line L2 intersect in the third grain boundaries; relative to a number N3 of the third grain boundaries through which imaginary line L2 crosses, wherein imaginary line L2 has a distance of 0.5 μm from surface S1 of first layer 3 or the interface, on the surface side of coating 2, of first layer 3 toward a side of base 1, $$0.1 \leq (N2/N1) - (N4/N3) \leq 0.40 \qquad \text{Formula 1.}$$

According to the present disclosure, cutting tool 10 that has excellent tool lifetime can be provided. The reason is presumably as follows.

(a) In cutting tool 10 of the present embodiment, on a cross section along a normal line of an interface between base 1 and coating 2, a ratio N2/N1 is 0.60 or more, wherein the ratio N2/N1 is a ratio of a number N2 of second grain boundaries that are grain boundaries with an absolute value of an angle relative to a straight line perpendicular to an imaginary line L1 of 15° or less at a position where a first grain boundary and imaginary line L1 intersect in the first grain boundaries; relative to a number N1 of the first grain boundaries through which imaginary line L1 crosses, wherein imaginary line L1 has the same distances from a surface S1 of first layer 3 or an interface, on a surface side of coating 2, of first layer 3 and from an interface I1, on a side of base 1, of first layer 3. According to this, crystals are arranged in a same direction in first layer 3, and thereby the blast treatment can be uniformly imparted.

As a result, the chipping resistance of cutting tool 10 can be improved.

(b) in cutting tool 10 of the present embodiment, on the cross section along the normal line of the interface between base 1 and coating 2, a ratio N4/N3 and the ratio N2/N1 satisfy a relationship of the following Formula 1, wherein the ratio N4/N3 is a ratio of: a number N4 of fourth grain boundaries that are grain boundaries with an absolute value of an angle relative to a straight line perpendicular to an imaginary line L2 of 15° or less at a position where a third grain boundary and imaginary line L2 intersect in the third grain boundaries; relative to a number N3 of the third grain boundaries through which imaginary line L2 crosses, wherein imaginary line L2 has a distance of 0.5 μm from surface S1 of first layer 3 or the interface, on the surface side of coating 2, of first layer 3 toward a side of base 1, $$0.1 \leq (N2/N1) - (N4/N3) \leq 0.40 \qquad \text{Formula 1.}$$

According to this, breakage of an edge portion of a crystal on surface S1 of first layer 3 or the interface on the surface side of coating 2 of first layer 3 is easily inhibited in performing the blast treatment, and thereby the blast treatment can be performed at a high pressure to impart excellent chipping resistance to cutting tool 10.

As above, the present disclosure can provide cutting tool 10 that has excellent tool lifetime.

<<Cutting Tool>>

As illustrated in FIG. 1 and FIG. 5, cutting tool 10 according to an embodiment of the present disclosure comprises base 1 and coating 2 disposed on base 1. Although coating 2 preferably covers an entire surface of base 1, cases where a part of base 1 is not covered with coating 2 and where constitution of coating 2 partially differs do not depart from the scope of the present embodiment. When a part of base 1 is not covered with coating 2, coating 2 is preferably disposed so as to cover at least a surface of a portion of base 1 involved with cutting. Although depending on a size and shape of base 1, the portion of base 1 involved with cutting herein means a region surrounded by: a cutting edge ridgeline of base 1; and an imaginary face where a distance from the cutting edge ridgeline toward a side of base 1 along a perpendicular line of a tangent of the cutting edge ridgeline is any one of, for example, 5 mm, 3 mm, 2 mm, 1 mm, and 0.5 mm.

Cutting tool 10 of the present embodiment can be suitably used as cutting tool 10 of a drill, an endmill, an indexable cutting insert for a drill, an indexable cutting insert for an endmill, an indexable cutting insert for milling, an indexable cutting insert for turning, a metal saw, a gear-cutting tool, a reamer, a tap, and the like.

<<Base>>

As base 1, any bases conventionally known as this type of base 1 may be used. For example, base 1 is preferably any of cemented carbide (such as WC-based cemented carbide, cemented carbide that contains WC and Co, cemented carbide in which a carbonitride of Ti, Ta, Nb, or the like is further added), cermet (that contains TiC, TiN, TiCN, or the like as a main component), high-speed steel, ceramics (such as titanium carbide, silicon carbide, silicon nitride, aluminum nitride, and aluminum oxide), a cubic boron nitride sintered material, or a diamond sintered material.

Among these bases 1, a WC-based cemented carbide or cermet (particularly, TiCN-based cermet) is particularly preferably selected. Since having particularly excellent balance between hardness and strength at high temperature, these bases 1 can contribute to lengthening of the lifetime of cutting tool 10 when used as base 1 of cutting tool 10.

<<Coating>>

Coating 2 includes a first layer 3. Coating 2 may be composed of only first layer 3, or coating 2 may include a layer other than first layer 3 ("other layer," described later) within a range that does not impair the effect of the present disclosure. A thickness of coating 2 may be 7 μm or more and 25 μm or less, or may be 10 μm or more and 15 μm or less. If the thickness of coating 2 is less than 7 μm, the lifetime of cutting tool 10 tends to be short derived from the too thin coating 2. Meanwhile, if the thickness of coating 2 is more than 25 μm, chipping of coating 2 tends to be generated in initial cutting, and the lifetime of cutting tool 10 tends to be short.

The thickness of coating 2 can be measured by observing a cross section of coating 2 along a normal line direction of the surface of coating 2 by using a scanning electron microscope (SEM) Specifically, with an observation magnification of 5,000 to 10,000 of the sectional sample and an observation area of 100 to 500 μm$^2$, thickness widths at any three points in any one field are measured, and their average value is specified as "thickness". A thickness of each layer described later is same as above unless otherwise described.

<<First Layer>>

<Composition of First Layer>

First layer 3 is composed of α-Al$_2$O$_3$. The description "composed of α-A$_2$O$_3$" means that a layer may be composed of only α-Al$_2$O$_3$, or a layer may contain an inevitable impurity in addition to α-Al$_2$O$_3$ within a range that does not impair the effect of the present disclosure. Examples of the inevitable impurity include a chlorine atom (Cl) and a sulfur atom (S). A total content rate of the inevitable impurity in first layer 3 may be, for example, 0 mass % or more and 0.10 mass % or less, or may be 0.01 mass % or more and 0.05 mass % or less.

First layer 3 composed of α-Al$_2$O$_3$ is specified by X-ray diffraction (XRD) and energy-dispersive X-ray analysis (EDX). The content rate of the inevitable impurity in first layer 3 is measured by secondary-ion mass spectrometry (SIMS). It has been confirmed that the measurement results have no variation even by randomly selecting the measurement positions as long as an identical cutting tool 10 is measured.

<Thickness of First Layer>

A thickness of first layer 3 is 2 μm or more and 15 μm or less. The thickness of first layer 3 may be 3 μm or more and 14 μm or less, may be 4 μm or more and 13 μm or less, or may be 5 μm or more and 12 μm or less.

<Surface Roughness Ra>

The thickness of first layer 3 may be less than 8 μm, and on a surface S1 of first layer 3 or on a surface positioned on an interface on the surface side of coating 2 of first layer 3, a surface roughness Ra may be 0.03 μm or more and 0.2 μm or less. According to this, the blast treatment tends to uniformly impart compressive residual stress to cutting tool 10 to impart more excellent chipping resistance, and therefore more excellent tool lifetime can be imparted to cutting tool 10. When the thickness of first layer 3 is less than 8 μm, the surface roughness Ra may be 0.03 μm or more and 0.15 μm or less, or may be 0.03 μm or more and 0.1 μm or less.

The thickness of first layer 3 may be 8 μm or more, and on a surface S1 of first layer 3 or on a surface positioned on an interface on the surface side of coating 2 of first layer 3, a surface roughness Ra may be 0.05 μm or more and 0.2 μm or less. According to this, the blast treatment tends to uniformly impart compressive residual stress to cutting tool 10 to impart more excellent chipping resistance, and therefore more excellent tool lifetime can be imparted to cutting tool 10. When the thickness of first layer 3 is 8 μm or more, the surface roughness Ra may be 0.05 μm or more and 0.18 μm or less, or may be 0.06 μm or more and 0.15 μm or less.

The surface roughness Ra is measured on a cross section of a cutting edge R along the normal line direction of the interface between base 1 and coating 2 in accordance with JIS B 0601:2001. More specifically, the cross section of cutting edge R along the normal line direction of the interface between base 1 and coating 2 is firstly photographed at a magnification of 1000 by using an SEM to obtain an image that includes surface S1 of first layer 3 or the surface positioned on the interface on the surface side of coating 2 of first layer 3. Then, in this image, any one rectangular observation field with 10 μm×10 μm is specified with a magnification of 10000. In this observation field, "surface S1 of first layer 3 or the surface positioned on the interface on the surface side of coating 2 of first layer 3" passes through any one pair of two sides opposite to each other. Then, in this observation field, contour information of the interface is extracted by using an image analysis software (ImageJ, version 1.51j8: https://imagej.nih.gov/ij/) to specify "arithmetical average roughness" of "surface S1 of first layer 3 or the surface positioned on the interface on the surface side of coating 2 of first layer 3" in the observation field. Then, on any other four observation fields in the above image, "arithmetical average roughness" of "surface S1 of first layer 3 or the surface positioned on the interface on the surface side of coating 2 of first layer 3" is specified. Then, an average value of "arithmetical average roughness" of "surface S1 of first layer 3 or the surface positioned on the interface on the surface side of coating 2 of first layer 3" in the total five observation fields is calculated to specify the surface roughness Ra. It has been confirmed that the measurement results have no variation even by randomly selecting the measurement positions as long as an identical first layer 3 is measured.

<Ratio N2/N1>

On the cross section along the normal line on the interface between base 1 and coating 2, a ratio N2/N1 of: a number N2 of second grain boundaries that are grain boundaries with an absolute value of an angle relative to a straight line perpendicular to an imaginary line L1 of 15° or less at a position where a first grain boundary and imaginary line L1 intersect in the first grain boundaries, relative to a number N1 of first grain boundaries through which imaginary line L1 with same distances from a surface S1 of first layer 3 or an interface on a surface side of coating 2 of first layer 3 and from an interface I1 on a side of base 1 of first layer 3 crosses is 0.60 or more. According to this, excellent chipping resistance can be imparted to cutting tool 10. The ratio N2/N1 may be 0.60 or more and 1.0 or less, may be 0.7 or more and 1.0 or less, or may be 0.8 or more and 1.0 or less. In FIG. 1 and FIG. 5, "distance between surface S1 of first layer 3 or the interface on the surface side of coating 2 of first layer 3 and imaginary L1" is described as D1. In FIG. 1 and FIG. 5. "distance between imaginary L1 and interface I1 on the side of base 1 of first layer 3" is described as D2. The term "same distances from surface S1 of first layer 3 or the interface on the surface side of coating 2 of first layer 3 and from interface I1 on a side of base 1 of first layer 3" can be rephrased that D1 and D2 are equal.

The term "grain boundaries with an absolute value of an angle relative to a straight line perpendicular to an imaginary line L1 of 15° or less at a position where a first grain boundary and imaginary line L1 intersect" is a concept that encompasses, at the "intersected position," a grain boundary GB downward right based on the straight line (FIG. 3) and a grain boundary GB upward right based on the straight line (FIG. 4). The term "grain boundaries with an absolute value of an angle relative to a straight line perpendicular to an imaginary line L1 of 15° or less at a position where a first grain boundary and imaginary line L1 intersect" means a grain boundary in which an angle α in FIG. 3 is 15° or less and a grain boundary in which an angle α in FIG. 4 is 15° or less. The term "grain boundaries with an absolute value of an angle relative to a straight line perpendicular to an imaginary line L2 of 15° or less at a position where a third grain boundary and imaginary line L2 intersect," described later, is same as above except that "first grain boundary" is to be replaced into "third grain boundary" and "imaginary line L1" is to be replaced into "imaginary line L2".

<Ratio N4/N3>

On the cross section along the normal line on the interface between base 1 and coating 2, a ratio N4/N3 may be 0.4 or more and 0.9 or less, wherein the ratio N4/N3 is a ratio of: a number N4 of fourth grain boundaries that are grain boundaries with an absolute value of an angle relative to a straight line perpendicular to an imaginary line L2 of 15° or less at a position where a third grain boundary and imaginary line L2 intersect in the third grain boundaries; relative to a number N3 of the third grain boundaries through which imaginary line L2 crosses, wherein imaginary line L2 has a distance of 0.5 μm from surface S1 of first layer 3 or the interface, on the surface side of coating 2, of first layer 3 to a side of base 1. According to this, more excellent tool lifetime can be imparted to cutting tool 10. The ratio N4/N3 may be 0.45 or more and 0.80 or less, may be 0.50 or more and 0.75 or less, or may be 0.55 or more and 0.70 or less. The term "grain boundaries with an absolute value of an angle relative to a straight line perpendicular to an imaginary line L2 of 15° or less at a position where a third grain boundary and imaginary line L2 intersect" is a concept that encompasses, at the "intersected position," a grain boundary downward right based on the straight line and a grain boundary upward right based on the straight line.

The ratio N2/N1 and the ratio N4/N3 can be specified by the following method.

(A1) A cross section of first layer 3 along the normal line direction of the interface between coating 2 and base 1 is subjected to electron backscattering diffraction image analysis by using a field emission type scanning electron microscope to produce a color map based on a crystal orientation of each crystal grain.

(B1) Based on the color map produced in (A1), a portion where α-$Al_2O_3$ is present is image-output in white and the other portions are image-output in black to obtain a first image. Then, from the viewpoint of removing noise, in the first image, each of: interface I1 on the side of base 1 of first layer 3; and surface S1 of first layer 3 or the interface on the surface side of coating 2 of first layer 3 is subjected to a moving average filter in a size of 15×15 pixels (that is, 0.3 μm×0.3 μm) to perform smoothing and then Ohtsu's binarization. Then, each column of the pixels in the first image subjected to the Ohtsu's binarization is observed from the side of base 1 in the order to specify a portion where black changes into white as interface I1 on the side of base 1 of first layer 3. Then, this interface is fitted with a linear expression to obtain a straight line L3. Then, each column of the pixels in the first image subjected to the Ohtsu's binarization is observed from the surface side of coating 2 in the order to specify a portion where black changes into white as surface S1 of first layer 3 or the interface on the surface side of coating 2 of first layer 3. Then, obtained is a straight line LA parallel to straight line L3 and in which a square sum of errors is minimum in the "surface S1 of first layer 3 or the interface on the surface side of coating 2 of first layer 3". Then, a straight line with an equal distance from straight line L3 and straight line L4 is obtained as imaginary line L1. A straight line having a distance of 0.5 μm from straight line L4 toward the side of base 1 is obtained as imaginary line L2.

(C1) Based on the color map produced in (A1), the grain boundary is image-output in black and the other portions are image-output in white to obtain a second image.

(D1) The second image and the first image are overlapped to specify each of the portion that corresponds to imaginary line L1 obtained in (B1) and the portion that corresponds to imaginary line L2 obtained in (B1) in the second image.

(E1) in the second image in which each of the portion that corresponds to imaginary line L1 obtained in (B1) and the portion that corresponds to imaginary line L2 obtained in (B1) is specified, as for any one rectangular field (field size: 40 μm×25 μm), coordinates of the grain boundary are calculated by image processing based on a straight line parallel to interface I1 on the side of base 1 of first layer 3. Based on the coordinates, inclination of the grain boundary (in other words, angle of the grain boundary) is determined.

(F1) In the rectangular field of (E1), specified are: a number N1 of first boundaries through which imaginary line L1 crosses; and a number N2 of second grain boundaries that are grain boundaries with an absolute value of an angle relative to a straight line perpendicular to imaginary line L1 of 15° or less at a position where the first grain boundary and imaginary line L1 intersect in the first grain boundaries. Then, N2 is divided by N1 to determine the ratio N2/N1. In the rectangular field of (E1), specified are: a number N3 of third grain boundaries through which imaginary line L2 crosses; and a number N4 of fourth grain boundaries that are grain boundaries with an absolute value of an angle relative to a straight line perpendicular to an imaginary line L2 of 15° or less at a position where the third grain boundary and imaginary line L2 intersect in the third grain boundaries. Then, N4 is divided by N3 to determine the ratio N4/N3.

It has been confirmed that the measurement results have no variation even by randomly selecting the measurement positions as long as an identical first layer 3 is measured.

<Relationship Between Ratio N2/N1 and Ratio N4/N3>

The ratio N4/N3 and the ratio N2/N1 satisfy a relationship of the following Formula 1, $$0.1 \le (N2/N1)-(N4/N3) \le 0.40 \qquad \text{Formula 1.}$$

According to this, excellent chipping resistance can be imparted to cutting tool 10. "(N2/N1)–(N4/N3)" may be 0.1 or more and 0.35 or less, may be 0.1 or more and 0.30 or less, or may be 0.1 or more and 0.20 or less.

<Ratio N5/N3>

The number N3 and a number N5 of fifth grain boundaries that are grain boundaries with an absolute value of an angle relative to a straight line perpendicular to imaginary line L2 of 45° or less at a position where the third grain boundary and imaginary line L2 intersect in the third grain boundaries may satisfy a relationship of the following Formula 2, $$(N5/N3)>0.96 \qquad \text{Formula 2.}$$

According to this, in a region, on the surface side of the coating, of the first layer, grain boundaries with an absolute value of an angle relative to a straight line perpendicular to imaginary line L2 of more than 45° at the position where the third grain boundary and imaginary line L2 intersect in the third grain boundaries (that is, grain boundaries with a large absolute value of the angle) can be reduced to inhibit breakage of the coating and peeling of the coating in a strong blast treatment, and therefore more excellent tool lifetime can be imparted to cutting tool 10. "N5/N3" may be more than 0.96 and 1.00 or less, may be 0.97 or more and 1.00 or less, or may be 0.98 or more and 1.00 or less.

"N5/N3" can be specified by the following method, "N5/N3" can be specified by the same method as of N4/N3 except that: the number N5 of the fifth grain boundaries that are grain boundaries with the absolute value of the angle relative to the straight line perpendicular to imaginary line L2 of 45° or less is specified; and N5 is divided by N3 to determine the ratio N5/N3. It has been confirmed that the measurement results have no variation even by randomly selecting the measurement positions as long as an identical first layer 3 is measured.

All the third grain boundaries may have the angle relative to the straight line perpendicular to imaginary line L2 at the position where the third grain boundary and imaginary line L2 cross of less than 45°. According to this, more excellent tool lifetime can be imparted to cutting tool 10. The third grain boundaries may not contain grain boundaries that have the angle relative to the straight line perpendicular to imaginary line L2 at the position where the third grain boundary and imaginary line L2 cross of 45° or more. According to this, more excellent tool lifetime can be imparted to cutting tool 10.

<Compressive Residual Stress of First Layer>

The absolute value of the compressive residual stress of first layer 3 may be 1.5 GPa or more and 4.0 GPa or less. According to this, more excellent tool lifetime can be imparted to cutting tool 10. The compressive residual stress of first layer 3 refers to a stress that is one of internal stress (inherent strain) present in an entirety of first layer 3 and represented by a "–" (negative) value (unit: "GPa" is used in the present embodiment). Accordingly, a concept of a large compressive residual stress indicates a large absolute value of the value, and a concept of a small compressive residual stress indicates a small absolute value of the value. That is, the absolute value of the compressive residual stress of 1.5 GPa or more and 4.0 GPa or less means that the compressive residual stress on first layer 3 is −4.0 GPa or more and −1.5 GPa or less. The absolute value of the compressive residual stress of first layer 3 may be 1.8 GPa or more and 3.5 GPa or less, or may be 20 GPa or more and 3.0 GPa or less.

The compressive residual stress of first layer 3 can be measured by a sin 2ψ method that uses an X-ray residual stress apparatus (see "X-Ray Stress Measurement" (The Society of Materials Science, Japan, published in 1981 by Yokendo Ltd. Publishers) pp. 54 to 66).

<Orientation Index TC (0 0 12) of First Layer>

An orientation index TC (0 0 12) of first layer 3 may be more than 4.5. According to this, strength of crystal grains of α-Al$_2$O$_3$ is more improved to more improve wear resistance, and therefore more excellent tool lifetime can be imparted to cutting tool 10. The orientation index TC (0 0 12) of first layer 3 may be more than 4.5 and 8.0 or less, may be 5.0 or more and 7.9 or less, or may be 6.0 or more and 7.9 or less.

"Orientation index TC (0 0 12) of first layer 3" herein means an orientation index TC (0 0 12) on a (0 0 12) face of first layer 3 among orientation indices TC (hkl) defined by a following Formula 3.

[Expression 1]

$$TC(hkl) = \frac{I(hkl)}{I_0(hkl)} \left\{ \frac{1}{n} \sum_{1}^{n} \frac{I(hkl)}{I_0(hkl)} \right\}^{-1} \quad \text{Formula 3}$$

In Formula 3, I (hkl) represents X-ray diffraction intensity on a (hkl) reflection face, and I$_0$ (hkl) represents a standard intensity in accordance with a PDF card number 00-010-0173 of ICDD. "n" in Formula 3 represents a number of reflection used for the calculation, and is 8 in the present embodiment. The (hkl) faces used for reflection are (012), (104), (110), (0 0 12), (113), (214), (116), and (300).

ICDD(R) is abbreviation of International Centre for Diffraction Data. PDF(R) is abbreviation of Powder Diffraction File.

The orientation index TC (0 0 12) of first layer 3 in the present embodiment can be represented by a following Formula 4.

[Expression 2]

$$TC(0\ 0\ 12) = \frac{I(0\ 0\ 12)}{I_0(0\ 0\ 12)} \left\{ \frac{1}{8} \sum_{1}^{8} \frac{I(hkl)}{I_0(hkl)} \right\}^{-1} \quad \text{Formula 4}$$

Therefore. "the orientation index TC (0 0 12) of first layer 3 is more than 4.5" means that a value determined with Formula 4 by substituting TC (0 0 12) in Formula 3 is more than 4.5.

The above TC (hkl) can be measured by analysis that uses an X-ray diffraction apparatus. TC (hkl) can be measured by using, for example, SmartLab®, manufactured by Rigaku Corporation. (scanning speed: 21.7°/min, step: 0.01°, scanning range: 15 to 140°) under the following conditions. In the present embodiment, the results of TC (hkl) measurement by using the X-ray diffraction apparatus are referred to as "XRD results".

(Conditions)
Characteristic X-ray: Cu-Kα
Tube voltage: 45 kV
Tube current: 200 mA
Filter: multilayer mirror
Optical system: concentration method
X-ray diffraction method: θ-2θ method In use of the X-ray diffraction apparatus, a rake face of the cutting tool is irradiated with X-ray. In typical, roughness is formed on the rake face and in contrast a flank face is flat, and thereby the flank face is preferably irradiated with X-ray in order to exclude a disturbance factor. Specifically, a portion on the flank face that spreads within a range of approximately 2 to 4 mm from a cutting edge ridgeline part is irradiated with X-ray. This improves reproducibility of the results. In the present embodiment, a value of the orientation index IC (hkl) of first layer 3 on the flank face of the base is equal to a value of TC (hkl) of first layer 3 on the rake face of the base.

It has been confirmed that the similar measurement results are obtained even by randomly selecting a plurality of measurement positions on the identical sample to perform the above measurement on each of the measurement positions.

<<Other Layers>>

Examples of other layers include an underlayer (FIG. 5), an intermediate layer (not illustrated), and a surface layer (not illustrated). The underlayer is a layer contacted with base 1. The surface layer is a layer positioned on a surface of coating 2. The intermediate layer is a layer disposed between the underlayer and first layer 3 or a layer disposed between first layer 3 and the surface layer.

<Underlayer>

The underlayer may be composed of TiN or TiCN. The description "composed of TiN or TiCN" means that a layer may be composed of only TiN or TiCN, or a layer may contain an inevitable impurity and the like in addition to TiN or TiCN. Here, examples of the inevitable impurity include a chlorine atom (Cl), an oxygen atom (O), a cobalt atom (Co), a tungsten atom (W), a nickel atom (Ni), and a boron atom (B). A total content rate of the inevitable impurity in the underlayer may be, for example, 0 mass % or more and 1.0 mass % or less, or may be 0.3 mass % or more and 0.6 mass % or less.

The underlayer composed of TiN or TiCN is measured by X-ray diffraction (XRD) and energy dispersive X-ray analysis (EDX). The content rate of the inevitable impurity in the underlayer is measured by secondary-ion mass spectrometry (SIMS). It has been confirmed that the measurement results have no variation even by randomly selecting the measurement positions as long as an identical underlayer is measured.

A thickness of the underlayer may be 0.1 μm or more and 2.0 μm or less, may be 0.5 μm or more and 1.5 μm or less, or may be 0.8 μm or more and 1.3 μm or less.

<Intermediate Layer>

The intermediate layer may be composed of TiCN The description "composed of TiCN" means that a layer may be composed of only TiCN, or a layer may contain an inevitable impurity and the like in addition to TiCN. Here, examples of the inevitable impurity include a chlorine atom (Cl), an oxygen atom (O), a cobalt atom (Co), a tungsten atom (W), a nickel atom (Ni), and a boron atom (B). A total content rate of the inevitable impurity in the underlayer may be, for example, 0 mass % or more and 1.0 mass % or less, or may be 0.3 mass % or more and 0.6 mass % or less.

The intermediate layer composed of TiCN is measured by X-ray diffraction (XRD) and energy dispersive X-ray analysis (EDX). The content rate of the inevitable impurity in the intermediate layer is measured by secondary-ion mass spectrometry (SIMS). It has been confirmed that the measurement results have no variation even by randomly selecting the measurement positions as long as an identical intermediate layer is measured.

A thickness of the intermediate layer may be 2.0 μm or more and 10 μm or less, or may be 4.0 μm or more and 8.0 μm or less.

<Surface Layer>

The surface layer may be composed of TiN. The description "composed of TiN" means that a layer may be composed only of TiN, or a layer may contain an inevitable impurity and the like in addition to TiN. Here, examples of the inevitable impurity include a chlorine atom (Cl), an oxygen atom (O), a cobalt atom (Co), a tungsten atom (W), a nickel atom (Ni), and a boron atom (B). A total content rate of the inevitable impurity in the surface layer may be, for example, 0 mass % or more and 1.0 mass % or less, or may be 0.1 mass % or more and 0.4 mass % or less.

The surface layer composed of TiN is measured by X-ray diffraction (XRD) and energy dispersive X-ray analysis (EDX). The content rate of the inevitable impurity in the surface layer is measured by secondary-ion mass spectrometry (SIMS). It has been confirmed that the measurement results have no variation even by randomly selecting the measurement positions as long as an identical surface layer is measured.

A thickness of the surface layer may be 0.5 μm or more and 3.0 μm or less, or may be 1.0 μm or more and 2.5 μm or less.

Embodiment 2: Method for Manufacturing Cutting Tool

Figure 2:
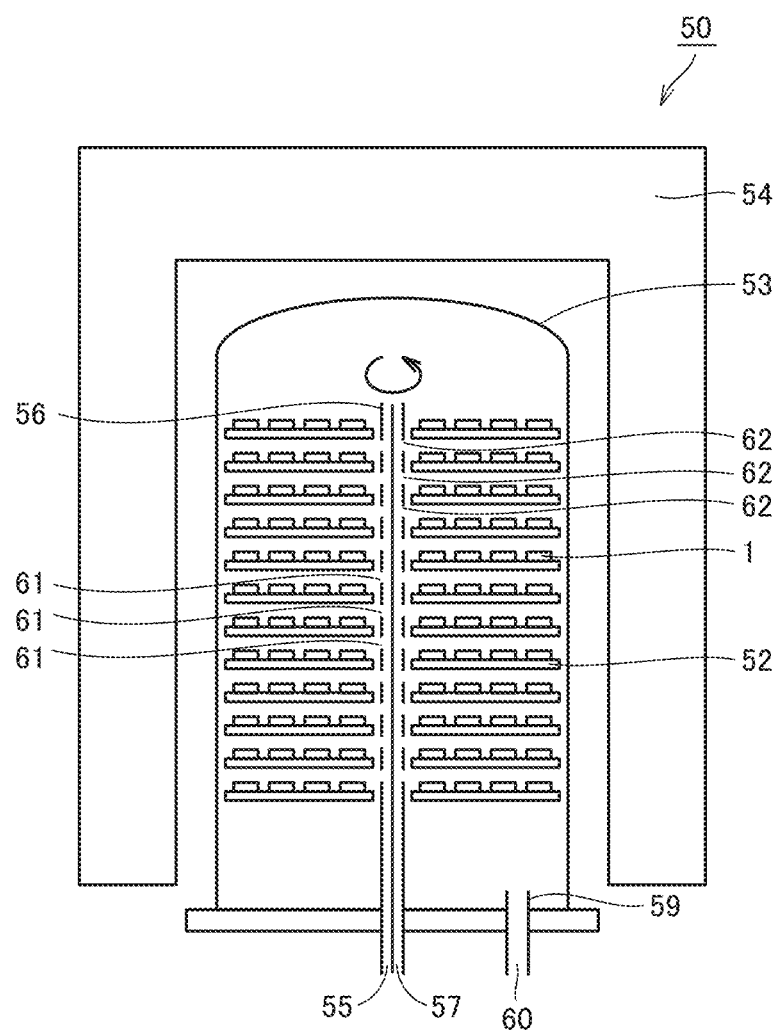
FIG. 2 is a schematic cross-sectional view of an example of a chemical vapor deposition (CVD) apparatus used for manufacturing a cutting tool of the present disclosure.

A method for manufacturing the cutting tool of the present embodiment will be described by using FIG. 2. FIG. 2 is a schematic cross-sectional view of an example of a CVD apparatus used for manufacturing the cutting tool of the present disclosure.

The method for manufacturing the cutting tool of the present embodiment is a method for manufacturing the cutting tool described in Embodiment 1, the method comprising: a first step of preparing a base L and a second step of forming a coating on base 1, wherein the second step comprises a second-a step of forming a first layer by a CVD method. A detail of each step will be described below.

<<First Step>>

In the first step, base 1 is prepared. As base 1, base 1 described in Embodiment 1 can be used.

For example, when a cemented carbide is used as base 1, commercially available base 1 may be used, or base 1 may be manufactured by a common powder metallurgy method. When base 1 is manufactured by a common powder metallurgy method, WC powder, Co powder, and the like are mixed with a ball mill or the like to obtain a mixed powder, for example. This mixed powder is dried, and then molded into a predetermined shape to obtain a molded article. Thereafter, the molded article is sintered to obtain a WC—Co-based cemented carbide (sintered material). Then, this sintered material is subjected to a predetermined cutting-edge treatment such as a homing treatment to manufacture base 1 composed of the WC—Co-based cemented carbide. Any bases conventionally known as such a type of base 1, other than the above base 1, may also be prepared.

<<Second Step>>

In the second step, the coating is formed on base 1 to obtain the cutting tool. The coating is formed by using, for example, a CVD apparatus 50 illustrated in FIG. 2. CVD apparatus 50 is equipped with: a plurality of base setting tools 52 for supporting base 1; and a reaction container 53 made of heat-resistant alloy steel that covers base setting tools 52. A temperature regulating apparatus 54 for regulating temperature in reaction container 53 is provided around reaction container 53. On reaction container 53, a gas-introducing tube that has a gas-introducing port is provided. The gas-introducing tube is extended in the vertical direction in an internal space of reaction container 53 in which base setting tools 52 are to be disposed and rotatably disposed with an axis in the vertical direction. On the gas-introducing tube, a plurality of injection holes (through holes) for injecting gas into reaction container 53 is provided. By using this CVD apparatus 50, the first layer to constitute the coating can be formed as follows.

The second step comprises the second-a step of forming the first layer by the CVD method. When the coating has "other layer" described in Embodiment 1, the second step may further comprise a step of forming the "other layer". The "other layer" can be formed by a conventionally known method.

<Second-a Step: Step of Forming First Layer by CVD Method>

In the second-a step, the first layer is formed by the CVD method. More specifically, base 1 is disposed on base setting tool 52, and a raw material gas for the first layer is introduced into reaction container 53 through the gas-introducing tube while regulating a temperature and a pressure in reaction container 53 within predetermined ranges. According to this, the first layer is formed on base 1.

With CVD apparatus 50, a nozzle 56 that has two introducing ports 55 and 57 is disposed. Nozzle 56 is disposed so as to penetrate the region in which base setting tool 52 is disposed. In a portion of nozzle 56 near base setting tool 52, a plurality of injecting holes (a first injecting hole 61, a second injecting hole 62, a third injecting hole (not illustrated), and a fourth injecting hole (not illustrated)) is formed.

Each gas introduced into nozzle 56 through introducing ports 55 and 57 is introduced into reaction container 53 via each different injecting hole without mixing even in nozzle 56. This nozzle 56 is rotatable with its axis as a central axis. A gas-discharging tube 59 is disposed on CVD apparatus 50, and an exhaust gas can be discharged to an outside through a gas-discharging port 60 of gas-discharging tube 59. Tools and the like in reaction container 53 are typically composed of graphite As the raw material gas, a mixed gas of $AlCl_3$, HCl, $CO_2$, $H_2S$, and $H_2$ is used. First, with first injecting hole 61 and second injecting hole 62, the film is formed under the following conditions (Condition 1) of a composition of the mixed gas, a flow rate of the mixed gas (namely, a flow rate of all the gases), a temperature of the mixed gas, and a pressure of the mixed gas.

(Condition 1)

$AlCl_3$: 2.0 vol % or more and 4.0 vol % or less
HCl: 2.0 vol % or more and 4.0 vol % or less
$CO_2$: 3.0 vol % or more and 5.0 vol % or less
$H_2S$: 0.20 vol % or more and 0.60 vol % or less
$H_2$: remainder
Temperature: 950° C. or more and 1020° C. or less
Pressure: 5 kPa or more and 100 kPa or less Then, with first injecting hole 61 and second injecting hole 62, the film is formed under conditions of a composition of the mixed gas, a temperature of the mixed gas, and a pressure of the mixed gas as the following "Condition 2A," and with the third injecting hole and the fourth injecting hole, the film is formed under conditions of a composition of the mixed gas, a temperature of the mixed gas, and a pressure of the mixed gas as the following "Condition 2B".
(Condition 2A)
  $AlCl_3$: 1.9 vol % or more and 4.0 vol % or less
  HCl: 2.0 vol % or more and 4.0 vol % or less
  $CO_2$: 4.0 vol % or more and 65 vol % or less
  $H_2S$: 0.03 vol % or more and 0.12 vol % or less
  $H_2$: remainder
  Temperature: 950° C. or more and 1020° C. or less
  Pressure: 10 kPa or more and 220 kPa or less
(Condition 2B)
  $AlCl_3$: 1.5 vol % or more and 4.0 vol % or less
  HCl: 2.0 vol % or more and 5.0 vol % or less
  $CO_2$: 3.0 vol % or more and 5.0 vol % or less
  $H_2S$: 0.01 vol % or more and 0.50 vol % or less
  $H_2$: remainder
  Temperature: 950° C. or more and 1020° C. or less
  Pressure: 10 kPa or more and 220 kPa or less A hole diameter Φ of the injecting hole may be, for example, 1.5 mm/2.5 mm. Here, the description "the hole diameter Φ of the injecting hole is 1.5 mm/2.5 mm" can be rephrased that, as for the injecting hole positioned on a cross section perpendicular to the longitudinal direction of nozzle 56, a short diameter of the injecting hole is 1.5 mm and a long diameter of the injecting hole is 2.5 mm.

A rotation speed of nozzle 56 may be 1.0 rpm or more and 8.0 rpm or less. A time for forming the first layer may be appropriately adjusted. Appropriately adjusting the time for forming the first layer can control the thickness of the first layer.

<Other Steps>

The second step may comprise a surface-treating step such as surface polishing, blast treatment, and the like in addition to the above steps.

<<Features of Method for Manufacturing Cutting Tool of Present Embodiment>>

In the method for manufacturing a cutting tool of the present embodiment, the film is formed under the condition of the above "Condition 1," and then the film is formed by combination of the conditions of the above "Condition 2A" and "Condition 2B" in the second-a step. According to this, the conditions with different growing directions of crystals are combined to be able to freely control the growing direction of the crystals, and therefore, on the cross section along the normal line of the interface between base 1 and the coating, a ratio N2/N1 is 0.60 or more, wherein the ratio N2/N1 is a ratio of: a number N2 of second grain boundaries that are grain boundaries with an absolute value of an angle relative to a straight line perpendicular to an imaginary line L1 of 15° or less at a position where a first grain boundary and imaginary line L1 intersect in the first grain boundaries; relative to a number N1 of the first grain boundaries through which imaginary line L1 crosses, wherein imaginary line L1 has the same distances from a surface of the first layer or an interface, on a surface side of the coating, of the first layer and from an interface, on a side of base 1, of the first layer crosses, and on the cross section along the normal line of the interface between base 1 and the coating, the ratio N4/N3 and the ratio N2/N1 can satisfy a relationship of the following Formula 1, wherein the ratio N4/N3 is a ratio of: a number N4 of fourth grain boundaries that are grain boundaries with an absolute value of an angle relative to a straight line perpendicular to an imaginary line L2 of 15° or less at a position where a third grain boundary and imaginary line L2 intersect in the third grain boundaries; relative to a number N3 of the third grain boundaries through which imaginary line L2 crosses, wherein imaginary line L2 has a distance of 0.5 μm from the surface of the first layer or the interface, on the surface side of the coating, of the first layer toward a side of base 1, $$0.1 \le (N2/N1) - (N4/N3) \le 0.40 \qquad \text{Formula 1.}$$

The achievement of the cutting tool of the present disclosure by adopting such a manufacturing method has been found as a result of intensive investigation by the present inventors.

[Supplement 1]

According to the cutting tool of the present disclosure, all the third grain boundaries may have the angle relative to the straight line perpendicular to imaginary line L2 of less than 45° at the position where the third grain boundary and imaginary line L2 intersect.

[Supplement 2]

According to the cutting tool of the present disclosure, the third grain boundaries may not contain a grain boundary that has the angle relative to the straight line perpendicular to imaginary line L2 of 45° or more at the position where the third grain boundary and imaginary line L2 intersect.

Examples

The present embodiment will be further specifically described with Examples. However, the present embodiment is not limited by these Examples.

<<Production of Cutting Tool>>

Cutting tools according to Samples 1 to 20 and 101 to 112 were produced as follows.

<First Step>

As a base, turning inserts that had compositions described in Table 11 and Table 12 (shape: CNMG120408N-GZ, manufactured by Sumitomo Electric Hardmetal Corp.) were prepared.

<Second Step>

The CVD method was performed under conditions described in Table 1 and Table 2 to form an underlayer on a surface of the base. The time for forming the film was adjusted so that a thickness of the underlayer was as described in Table 11 and Table 12. Then, the CVD method was performed under conditions described in Table 1 and Table 2 to form an intermediate layer on a surface of the underlayer. The time for forming the film was adjusted so that a thickness of the intermediate layer was as described in Table 11 and Table 12.

The CVD method was performed to form a first layer on a surface of the intermediate layer (the second-a step). For forming the first layer, the CVD method was firstly performed under conditions described in Table 3 and Table 4 (Step I) Then, with a first injecting hole and a second injecting hole, the CVD method was performed under conditions described in Table 5 and Table 6, and with a third injecting hole and a fourth injecting hole, the CVD method was performed under conditions described in Table 7 and Table 8 to form the first layer (Step II). A case where "-" is described in all the columns in Table 5 to Table 8 means that the first layer is formed by performing only Step I. A case where "-" is not described in all the columns in Table 5 and Table 6 and where "-" is described in all the columns in Table 7 and Table 8 means that the first injecting hole and the second injecting hole are used but the third injecting hole and the fourth injecting hole are not used in Step II The total time of Step I and Step II was adjusted so that the thickness of the first layer was as described in Table 13 and Table 14. When both Step I and Step II were performed, a ratio between the time for Step I and the time for Step II was set to 10:1.

Then, the CVD method was performed under conditions described in Table 9 and Table 10 to form a surface layer on the surface of the first layer. The time for forming the film was adjusted so that a thickness of the surface layer was as described in Table 15 and Table 16. A case where "–" is described in all the columns of the column "Film forming condition for surface layer" in Table 9 and Table 10 means that the surface layer is not formed.

Then, when the surface layer was formed on the surface of the first layer, a blast treatment was performed on the surface of the surface layer under the following condition. When the surface layer was not formed on the surface of the first layer, a blast treatment was performed on the surface of the first layer under the following condition.

(Condition)
Type of media: ceramics
Average particle diameter of media: 150 μm
Concentration of media: 300 g/min
Projection angle: 75°
Projection distance: 35 mm
Projection pressure: as described in Table 9 and Table 10
Time: 25 seconds
Rotation speed of cutting tool: 60 rpm Then, the cutting tool after the blast treatment was visually observed to specify presence or absence of peeling of the coating. The obtained results are described in the column "Presence/absence of peeling after blasting" in Table 9 and Table 10.

The cutting tools according to Samples 1 to 20 and 101 to 112 were produced as above.

[Table 1]

TABLE 1

| | Film forming condition for underlayer | | | | | Film forming condition for intermediate layer | | | | |
| | Composition of reaction gas | | | | | Composition of reaction gas | | | | |
| Sample No. | TiCl$_4$ [vol %] | N$_2$ [vol %] | H$_2$ [vol %] | Pressure [kPa] | Temperature [° C.] | TiCl$_4$ [vol %] | CH$_3$CN [vol %] | H$_2$ [vol %] | Pressure [kPa] | Temperature [° C.] |
|---|---|---|---|---|---|---|---|---|---|---|
| 1 | 2.0 | 39.7 | Remainder | 6.7 | 915 | 2.0 | 0.7 | Remainder | 9.0 | 860 |
| 2 | 2.0 | 39.7 | Remainder | 6.7 | 915 | 2.0 | 0.7 | Remainder | 9.0 | 860 |
| 3 | 2.0 | 39.7 | Remainder | 6.7 | 915 | 2.0 | 0.7 | Remainder | 9.0 | 860 |
| 4 | 2.0 | 39.7 | Remainder | 6.7 | 915 | 2.0 | 0.7 | Remainder | 9.0 | 860 |
| 5 | 2.0 | 39.7 | Remainder | 6.7 | 915 | 2.0 | 0.7 | Remainder | 9.0 | 860 |
| 6 | 2.0 | 39.7 | Remainder | 6.7 | 915 | 2.0 | 0.7 | Remainder | 9.0 | 860 |
| 7 | 2.0 | 39.7 | Remainder | 6.7 | 915 | 2.0 | 0.7 | Remainder | 9.0 | 860 |
| 8 | 2.0 | 39.7 | Remainder | 6.7 | 915 | 2.0 | 0.7 | Remainder | 9.0 | 860 |
| 9 | 2.0 | 39.7 | Remainder | 6.7 | 915 | 2.0 | 0.7 | Remainder | 9.0 | 860 |
| 10 | 2.0 | 39.7 | Remainder | 6.7 | 915 | 2.0 | 0.7 | Remainder | 9.0 | 860 |
| 11 | 2.0 | 39.7 | Remainder | 6.7 | 915 | 2.0 | 0.7 | Remainder | 9.0 | 860 |
| 12 | 2.0 | 39.7 | Remainder | 6.7 | 915 | 2.0 | 0.7 | Remainder | 9.0 | 860 |
| 13 | 2.0 | 39.7 | Remainder | 6.7 | 915 | 2.0 | 0.7 | Remainder | 9.0 | 860 |
| 14 | 2.0 | 39.7 | Remainder | 6.7 | 915 | 2.0 | 0.7 | Remainder | 9.0 | 860 |
| 15 | 2.0 | 39.7 | Remainder | 6.7 | 915 | 2.0 | 0.7 | Remainder | 9.0 | 860 |
| 16 | 2.0 | 39.7 | Remainder | 6.7 | 915 | 2.0 | 0.7 | Remainder | 9.0 | 860 |
| 17 | 2.0 | 39.7 | Remainder | 6.7 | 915 | 2.0 | 0.7 | Remainder | 9.0 | 860 |
| 18 | 2.0 | 39.7 | Remainder | 6.7 | 915 | 2.0 | 0.7 | Remainder | 9.0 | 860 |
| 19 | 2.0 | 39.7 | Remainder | 6.7 | 915 | 2.0 | 0.7 | Remainder | 9.0 | 860 |
| 20 | 2.0 | 39.7 | Remainder | 6.7 | 915 | 2.0 | 0.7 | Remainder | 9.0 | 860 |

[Table 2]

TABLE 2

| | Film forming condition for underlayer | | | | | Film forming condition for intermediate layer | | | | |
| | Composition of reaction gas | | | | | Composition of reaction gas | | | | |
| Sample No. | TiCl$_4$ [vol %] | N$_2$ [vol %] | H$_2$ [vol %] | Pressure [kPa] | Temperature [° C.] | TiCl$_4$ [vol %] | CH$_3$CN [vol %] | H$_2$ [vol %] | Pressure [kPa] | Temperature [° C.] |
|---|---|---|---|---|---|---|---|---|---|---|
| 101 | 2.0 | 39.7 | Remainder | 6.7 | 915 | 2.0 | 0.7 | Remainder | 9.0 | 860 |
| 102 | 2.0 | 39.7 | Remainder | 6.7 | 915 | 2.0 | 0.7 | Remainder | 9.0 | 860 |
| 103 | 2.0 | 39.7 | Remainder | 6.7 | 915 | 2.0 | 0.7 | Remainder | 9.0 | 860 |
| 104 | 2.0 | 39.7 | Remainder | 6.7 | 915 | 2.0 | 0.7 | Remainder | 9.0 | 860 |
| 105 | 2.0 | 39.7 | Remainder | 6.7 | 915 | 2.0 | 0.7 | Remainder | 9.0 | 860 |
| 106 | 2.0 | 39.7 | Remainder | 6.7 | 915 | 2.0 | 0.7 | Remainder | 9.0 | 860 |
| 107 | 2.0 | 39.7 | Remainder | 6.7 | 915 | 2.0 | 0.7 | Remainder | 9.0 | 860 |
| 108 | 2.0 | 39.7 | Remainder | 6.7 | 915 | 2.0 | 0.7 | Remainder | 9.0 | 860 |
| 109 | 2.0 | 39.7 | Remainder | 6.7 | 915 | 2.0 | 0.7 | Remainder | 9.0 | 860 |
| 110 | 2.0 | 39.7 | Remainder | 6.7 | 915 | 2.0 | 0.7 | Remainder | 9.0 | 860 |
| 111 | 2.0 | 39.7 | Remainder | 6.7 | 915 | 2.0 | 0.7 | Remainder | 9.0 | 860 |
| 112 | 2.0 | 39.7 | Remainder | 6.7 | 915 | 2.0 | 0.7 | Remainder | 9.0 | 860 |

[Table 3]

TABLE 3

| | | | \multicolumn{6}{c}{Film forming condition for first layer} | | |
| | | | \multicolumn{5}{c}{Condition 1} | | Hole diameter of | |
| | | | \multicolumn{5}{c}{Composition of reaction gas} | Number of | injecting | Rotation |
| Sample No. | Temperature [° C.] | Pressure [kPa] | $AlCl_3$ [vol %] | HCl [vol %] | $CO_2$ [vol %] | $H_2S$ [vol %] | $H_2$ [vol %] | injecting holes [−] | hole Φ[mm] | speed [rpm] |
|---|---|---|---|---|---|---|---|---|---|---|
| 1 | 1000 | 6.6 | 2.50 | 2.50 | 4.10 | 0.33 | Remainder | 2 | 1.5/2.5 | 2.0 |
| 2 | 1000 | 6.6 | 2.50 | 2.50 | 4.10 | 0.33 | Remainder | 2 | 1.5/2.5 | 2.0 |
| 3 | 1000 | 6.6 | 2.50 | 2.50 | 4.10 | 0.33 | Remainder | 2 | 1.5/2.5 | 2.0 |
| 4 | 1000 | 6.6 | 2.50 | 2.50 | 4.10 | 0.33 | Remainder | 2 | 1.5/2.5 | 2.0 |
| 5 | 1000 | 6.6 | 2.50 | 2.50 | 3.00 | 0.33 | Remainder | 2 | 1.5/2.5 | 2.0 |
| 6 | 1000 | 6.6 | 2.50 | 2.50 | 5.00 | 0.33 | Remainder | 2 | 1.5/2.5 | 2.0 |
| 7 | 1000 | 6.6 | 2.50 | 2.50 | 4.10 | 0.33 | Remainder | 2 | 1.5/2.5 | 2.0 |
| 8 | 1000 | 6.6 | 2.50 | 2.50 | 4.10 | 0.33 | Remainder | 2 | 1.5/2.5 | 2.0 |
| 9 | 1000 | 6.6 | 2.5 | 2.5 | 4.1 | 0.33 | Remainder | 2 | 1.5/2.5 | 2 |
| 10 | 1000 | 6.6 | 2.5 | 2.5 | 4.1 | 0.33 | Remainder | 2 | 1.5/2.5 | 2 |
| 11 | 1000 | 6.6 | 2.5 | 2.5 | 4.1 | 0.33 | Remainder | 2 | 1.5/2.5 | 2 |
| 12 | 1000 | 6.6 | 2.5 | 2.5 | 4.1 | 0.33 | Remainder | 2 | 1.5/2.5 | 2 |
| 13 | 1000 | 6.6 | 2.50 | 4.00 | 4.10 | 0.25 | Remainder | 2 | 1.5/2.5 | 2.0 |
| 14 | 1000 | 6.6 | 2.50 | 2.50 | 4.10 | 0.33 | Remainder | 2 | 1.5/2.5 | 2.0 |
| 15 | 1000 | 6.6 | 2.50 | 2.50 | 4.10 | 0.33 | Remainder | 2 | 1.5/2.5 | 2.0 |
| 16 | 1000 | 6.6 | 2.50 | 2.50 | 4.10 | 0.33 | Remainder | 2 | 1.5/2.5 | 2.0 |
| 17 | 1000 | 6.6 | 2.50 | 2.50 | 4.10 | 0.33 | Remainder | 2 | 1.5/2.5 | 2.0 |
| 18 | 1000 | 6.6 | 2.50 | 2.50 | 4.10 | 0.33 | Remainder | 2 | 1.5/2.5 | 2.0 |
| 19 | 1000 | 6.6 | 2.50 | 2.50 | 4.10 | 0.33 | Remainder | 2 | 1.5/2.5 | 2.0 |
| 20 | 1000 | 6.6 | 2.50 | 2.50 | 4.10 | 0.33 | Remainder | 2 | 1.5/2.5 | 2.0 |

[Table 4]

TABLE 4

| Sample No. | Temperature [° C.] | Pressure [kPa] | $AlCl_3$ [vol %] | HCl [vol %] | $CO_2$ [vol %] | $H_2S$ [vol %] | $H_2$ [vol %] | Number of injecting holes [−] | Hole diameter of injecting hole Φ[mm] | Rotation speed [rpm] |
|---|---|---|---|---|---|---|---|---|---|---|
| 101 | 1000 | 68 | 2.50 | 2.50 | 4.10 | 0.33 | Remainder | 2 | 1.5/2.5 | 2 |
| 102 | 1000 | 66 | 2.50 | 2.50 | 4.10 | 0.33 | Remainder | 2 | 1.5/2.5 | 2 |
| 103 | 1000 | 66 | 2.50 | 2.50 | 4.10 | 0.33 | Remainder | 2 | 1.5/2.5 | 2 |
| 104 | 1000 | 66 | 2.50 | 2.50 | 4.10 | 0.33 | Remainder | 2 | 1.5/2.5 | 2 |
| 105 | 1000 | 66 | 2.50 | 2.50 | 4.10 | 0.33 | Remainder | 2 | 1.5/2.5 | 2 |
| 106 | 1000 | 66 | 2.50 | 2.50 | 4.10 | 0.33 | Remainder | 2 | 1.5/2.5 | 2 |
| 107 | 1000 | 66 | 2.50 | 2.50 | 4.10 | 0.33 | Remainder | 2 | 1.5/2.5 | 2 |
| 108 | 1000 | 66 | 2.5 | 3.1 | 4.1 | 0.21 | Remainder | 2 | 1.5/2.5 | 2 |
| 109 | 1000 | 66 | 2.50 | 2.50 | 4.10 | 0.33 | Remainder | 2 | 1.5/2.5 | 2 |
| 110 | 1000 | 66 | 2.50 | 2.50 | 4.10 | 0.33 | Remainder | 2 | 1.5/2.5 | 2 |
| 111 | 1000 | 66 | 2.50 | 2.50 | 4.10 | 0.33 | Remainder | 2 | 1.5/2.5 | 2 |
| 112 | 1000 | 66 | 2.50 | 2.50 | 4.10 | 0.33 | Remainder | 2 | 1.5/2.5 | 2 |

[Table 5]

TABLE 5

Film forming condition for first layer — Condition 2A

| Sample No. | Temperature [° C.] | Pressure [kPa] | $AlCl_3$ [vol %] | HCl [vol %] | $CO_2$ [vol %] | $H_2S$ [vol %] | $H_2$ [vol %] | Number of injecting holes [−] | Hole diameter of injecting hole Φ[mm] | Rotation speed [rpm] |
|---|---|---|---|---|---|---|---|---|---|---|
| 1 | 1000 | 15 | 2.50 | 4.00 | 4.50 | 0.05 | Remainder | 2 | 1.5/2.5 | 7.0 |
| 2 | 1000 | 15 | 2.50 | 4.00 | 4.50 | 0.05 | Remainder | 2 | 1.5/2.5 | 7.0 |

TABLE 5-continued

| | Film forming condition for first layer | | | | | | | | | |
|---|---|---|---|---|---|---|---|---|---|---|
| | Condition 2A | | | | | | | | Hole diameter of | |
| | | | Composition of reaction gas | | | | | Number of | injecting | Rotation |
| Sample No. | Temperature [° C.] | Pressure [kPa] | AlCl$_3$ [vol %] | HCl [vol %] | CO$_2$ [vol %] | H$_2$S [vol %] | H$_2$ [vol %] | injecting holes [-] | hole Φ[mm] | speed [rpm] |
| 3 | 1000 | 15 | 2.50 | 4.00 | 4.50 | 0.05 | Remainder | 2 | 1.5/2.5 | 7.0 |
| 4 | 1000 | 15 | 2.50 | 4.00 | 4.50 | 0.05 | Remainder | 2 | 1.5/2.5 | 7.0 |
| 5 | 1000 | 15 | 2.50 | 4.00 | 4.50 | 0.05 | Remainder | 2 | 1.5/2.5 | 7.0 |
| 6 | 1000 | 15 | 2.50 | 4.00 | 4.50 | 0.05 | Remainder | 2 | 1.5/2.5 | 7.0 |
| 7 | 1000 | 15 | 1.9 | 4.5 | 4.5 | 0.05 | Remainder | 2 | 1.5/2.5 | 7.0 |
| 8 | 1000 | 15 | 2.5 | 3.6 | 5.4 | 0.05 | Remainder | 2 | 1.5/2.5 | 7.0 |
| 9 | 1000 | 15 | 2.5 | 4 | 4.5 | 0.05 | Remainder | 2 | 1.5/2.5 | 7 |
| 10 | 1000 | 15 | 3.2 | 3.6 | 4.5 | 0.05 | Remainder | 2 | 1.5/2.5 | 7 |
| 11 | 1000 | 15 | 2.5 | 4 | 4.5 | 0.05 | Remainder | 2 | 1.5/2.5 | 7 |
| 12 | 1000 | 15 | 3.2 | 3.8 | 4.5 | 0.05 | Remainder | 2 | 1.5/2.5 | 7 |
| 13 | 1000 | 15 | 2.50 | 4.00 | 4.50 | 0.05 | Remainder | 2 | 1.5/2.5 | 7.0 |
| 14 | 1000 | 15 | 2.60 | 4.00 | 4.50 | 0.05 | Remainder | 2 | 1.5/2.5 | 7.0 |
| 15 | 1000 | 15 | 2.50 | 4.00 | 4.50 | 0.05 | Remainder | 2 | 1.5/2.5 | 7.0 |
| 16 | 1000 | 15 | 2.50 | 4.00 | 4.50 | 0.05 | Remainder | 2 | 1.5/2.5 | 7.0 |
| 17 | 1000 | 15 | 2.50 | 4.00 | 4.50 | 0.05 | Remainder | 2 | 1.5/2.5 | 7.0 |
| 18 | 1000 | 15 | 2.50 | 4.00 | 4.50 | 0.05 | Remainder | 2 | 1.5/2.5 | 7.0 |
| 19 | 1000 | 15 | 2.50 | 4.00 | 4.50 | 0.05 | Remainder | 2 | 1.5/2.5 | 7.0 |
| 20 | 1000 | 15 | 2.50 | 4.00 | 4.50 | 0.05 | Remainder | 2 | 1.5/2.5 | 7.0 |

[Table 6]

TABLE 6

| | Film forming condition for first layer | | | | | | | | | |
|---|---|---|---|---|---|---|---|---|---|---|
| | Condition 2A | | | | | | | | Hole diameter of | |
| | | | Composition of reaction gas | | | | | Number of | injecting | Rotation |
| Sample No. | Temperature [° C.] | Pressure [kPa] | AlCl$_3$ [vol %] | HCl [vol %] | CO$_2$ [vol %] | H$_2$S [vol %] | H$_2$ [vol %] | injecting holes [-] | hole Φ[mm] | speed [rpm] |
| 101 | 1000 | 150 | 1.50 | 4.50 | 6.10 | 0.08 | Remainder | 2 | 1.5/2.5 | 2 |
| 102 | 1000 | 150 | 1.50 | 7.50 | 5.70 | 0.05 | Remainder | 2 | 1.5/2.5 | 2 |
| 103 | — | — | — | — | — | — | — | — | — | — |
| 104 | — | — | — | — | — | — | — | — | — | — |
| 105 | — | — | — | — | — | — | — | — | — | — |
| 106 | 1000 | 150 | 1.50 | 7.50 | 5.70 | 0.05 | Remainder | 2 | 1.5/2.5 | 2 |
| 107 | 1000 | 150 | 1.50 | 7.50 | 5.70 | 0.05 | Remainder | 2 | 1.5/2.5 | 2 |
| 108 | — | — | — | — | — | — | — | — | — | — |
| 109 | 1000 | 150 | 1.50 | 7.50 | 5.70 | 0.05 | Remainder | 2 | 1.5/2.5 | 2 |
| 110 | 1000 | 150 | 1.50 | 7.50 | 5.70 | 0.05 | Remainder | 2 | 1.5/2.5 | 2 |
| 111 | 1000 | 150 | 1.50 | 7.50 | 5.70 | 0.05 | Remainder | 2 | 1.5/2.5 | 2 |
| 112 | 1000 | 150 | 1.50 | 7.50 | 5.70 | 0.05 | Remainder | 2 | 1.5/2.5 | 2 |

[Table 7]

TABLE 7

| | Film forming condition for first layer | | | | | | | | | |
|---|---|---|---|---|---|---|---|---|---|---|
| | Condition 2B | | | | | | | | Hole diameter of | |
| | | | Composition of reaction gas | | | | | Number of | injecting | Rotation |
| Sample No. | Temperature [° C.] | Pressure [kPa] | AlCl$_3$ [vol %] | HCl [vol %] | CO$_2$ [vol %] | H$_2$S [vol %] | H$_2$ [vol %] | injecting holes [-] | hole Φ[mm] | speed [rpm] |
| 1 | 1000 | 15 | 1.5 | 2.5 | 3.5 | 0.4 | Remainder | 2 | 1.5/2.5 | 7.0 |
| 2 | 1000 | 15 | 1.8 | 2.5 | 3.8 | 0.4 | Remainder | 2 | 1.5/2.5 | 7.0 |
| 3 | 1000 | 15 | 1.5 | 2.5 | 3.8 | 0.4 | Remainder | 2 | 1.5/2.5 | 7.0 |
| 4 | 1000 | 15 | 1.5 | 2.6 | 3.5 | 0.4 | Remainder | 2 | 1.5/2.5 | 7.0 |
| 5 | 1000 | 15 | 1.5 | 2.8 | 3.5 | 0.4 | Remainder | 2 | 1.5/2.5 | 7.0 |

TABLE 7-continued

| | | | Film forming condition for first layer | | | | | | | |
|---|---|---|---|---|---|---|---|---|---|---|
| | | | Condition 2B | | | | | | Hole diameter of | |
| | | | Composition of reaction gas | | | | | Number of | injecting | Rotation |
| Sample No. | Temperature [° C.] | Pressure [kPa] | $AlCl_3$ [vol %] | HCl [vol %] | $CO_2$ [vol %] | $H_2S$ [vol %] | $H_2$ [vol %] | injecting holes [-] | hole Φ[mm] | speed [rpm] |
| 6 | 1000 | 15 | 1.5 | 2.5 | 3.5 | 0.4 | Remainder | 2 | 1.5/2.5 | 7.0 |
| 7 | 1000 | 15 | 1.7 | 2.5 | 3.8 | 0.43 | Remainder | 2 | 1.5/2.5 | 7.0 |
| 8 | 1000 | 15 | 1.5 | 5 | 3.5 | 0.4 | Remainder | 2 | 1.5/2.5 | 7.0 |
| 9 | 1000 | 15 | 1.7 | 2.5 | 3.5 | 0.45 | Remainder | 2 | 1.5/2.5 | 7 |
| 10 | 1000 | 15 | 1.5 | 3.1 | 3.5 | 0.4 | Remainder | 2 | 1.5/2.5 | 7 |
| 11 | 1000 | 15 | 1.7 | 2.5 | 3.5 | 0.45 | Remainder | 2 | 1.5/2.5 | 7 |
| 12 | 1000 | 15 | 1.6 | 3.1 | 3.5 | 0.4 | Remainder | 2 | 1.5/2.5 | 7 |
| 13 | 1000 | 15 | 1.5 | 2.5 | 3.5 | 0.4 | Remainder | 2 | 1.5/2.5 | 7.0 |
| 14 | 1000 | 15 | 1.5 | 2.6 | 3.5 | 0.4 | Remainder | 2 | 1.5/2.5 | 7.0 |
| 15 | 1000 | 15 | 1.5 | 2.8 | 3.5 | 0.4 | Remainder | 2 | 1.5/2.5 | 7.0 |
| 16 | 1000 | 15 | 1.5 | 2.5 | 3.5 | 0.4 | Remainder | 2 | 1.5/2.5 | 7.0 |
| 17 | 1000 | 15 | 1.8 | 2.5 | 3.8 | 0.4 | Remainder | 2 | 1.5/2.5 | 7.0 |
| 18 | 1000 | 15 | 1.5 | 2.5 | 3.5 | 0.4 | Remainder | 2 | 1.5/2.5 | 7.0 |
| 19 | 1000 | 15 | 1.5 | 2.8 | 3.5 | 0.4 | Remainder | 2 | 1.5/2.5 | 7.0 |
| 20 | 1000 | 15 | 1.5 | 2.5 | 3.5 | 0.4 | Remainder | 2 | 1.5/2.5 | 7.0 |

[Table 8]

TABLE 8

| | | | Film forming condition for first layer | | | | | | | |
|---|---|---|---|---|---|---|---|---|---|---|
| | | | Condition 2B | | | | | | Hole diameter of | |
| | | | Composition of reaction gas | | | | | Number of | injecting | Rotation |
| Sample No. | Temperature [° C.] | Pressure [kPa] | $AlCl_3$ [vol %] | HCl [vol %] | $CO_2$ [vol %] | $H_2S$ [vol %] | $H_2$ [vol %] | injecting holes [-] | hole Φ[mm] | speed [rpm] |
| 101 | — | — | — | — | — | — | — | — | — | — |
| 102 | 1000 | 150 | 1.50 | 7.50 | 5.70 | 0.05 | Remainder | 2 | 1.5/2.5 | 2 |
| 103 | — | — | — | — | — | — | — | — | — | — |
| 104 | — | — | — | — | — | — | — | — | — | — |
| 105 | — | — | — | — | — | — | — | — | — | — |
| 106 | — | — | — | — | — | — | — | — | — | — |
| 107 | — | — | — | — | — | — | — | — | — | — |
| 108 | — | — | — | — | — | — | — | — | — | — |
| 108 | — | — | — | — | — | — | — | — | — | — |
| 110 | — | — | — | — | — | — | — | — | — | — |
| 111 | — | — | — | — | — | — | — | — | — | — |
| 112 | — | — | — | — | — | — | — | — | — | — |

[Table 9]

TABLE 9

| | Film forming condition for surface layer | | | | Blast condition | |
|---|---|---|---|---|---|---|
| | Composition of reaction gas | | | | Projection | Presence/absence |
| Sample No. | $TiCl_4$ [vol %] | $N_2$ [vol %] | $H_2$ [vol %] | Pressure [kPa] | Temperature [° C.] | pressure [MPa] | of peeling after blasting |
| 1 | 0.5 | 41.2 | Remainder | 79.8 | 980 | 0.15 | Absence |
| 2 | 0.5 | 41.2 | Remainder | 79.8 | 980 | 0.3 | Absence |
| 3 | 0.5 | 41.2 | Remainder | 79.8 | 980 | 0.15 | Absence |
| 4 | 0.5 | 41.2 | Remainder | 79.8 | 980 | 0.3 | Absence |
| 5 | 0.5 | 41.2 | Remainder | 79.8 | 980 | 0.15 | Absence |
| 6 | 0.5 | 41.2 | Remainder | 79.8 | 980 | 0.16 | Absence |
| 7 | 0.5 | 41.2 | Remainder | 79.8 | 980 | 0.15 | Absence |
| 8 | 0.5 | 41.2 | Remainder | 79.8 | 980 | 0.15 | Absence |
| 9 | 0.5 | 41.2 | Remainder | 79.8 | 980 | 0.3 | Absence |
| 10 | 0.5 | 41.2 | Remainder | 79.8 | 980 | 0.3 | Absence |

TABLE 9-continued

| | Film forming condition for surface layer | | | | | Blast condition | |
|---|---|---|---|---|---|---|---|
| | Composition of reaction gas | | | | | Projection | Presence/absence |
| Sample No. | TiCl$_4$ [vol %] | N$_2$ [vol %] | H$_2$ [vol %] | Pressure [kPa] | Temperature [° C.] | pressure [MPa] | of peeling after blasting |
| 11 | 0.5 | 41.2 | Remainder | 79.8 | 980 | 0.3 | Absence |
| 12 | 0.5 | 41.2 | Remainder | 79.8 | 980 | 0.3 | Absence |
| 13 | 0.5 | 41.2 | Remainder | 79.8 | 980 | 0.15 | Absence |
| 14 | 0.5 | 41.2 | Remainder | 79.8 | 980 | 0.15 | Absence |
| 15 | 0.5 | 41.2 | Remainder | 79.8 | 980 | 0.15 | Absence |
| 16 | 0.5 | 41.2 | Remainder | 79.8 | 980 | 0.15 | Absence |
| 17 | — | — | — | — | — | 0.15 | Absence |
| 18 | — | — | — | — | — | 0.3 | Absence |
| 19 | — | — | — | — | — | 0.15 | Absence |
| 20 | — | — | — | — | — | 0.3 | Absence |

[Table 10]

TABLE 10

| | Film forming condition for surface layer | | | | | Blast condition | |
|---|---|---|---|---|---|---|---|
| | Composition of reaction gas | | | | | Projection | Presence/absence |
| Sample No. | TiCl$_4$ [vol %] | N$_2$ [vol %] | H$_2$ [vol %] | Pressure [kPa] | Temperature [° C.] | pressure [MPa] | of peeling after blasting |
| 101 | 0.5 | 41.2 | Remainder | 79.8 | 980 | 0.3 | Presence |
| 102 | 0.5 | 41.2 | Remainder | 79.8 | 980 | 0.3 | Presence |
| 103 | 0.5 | 41.2 | Remainder | 79.8 | 980 | 0.15 | Absence |
| 104 | 0.5 | 41.2 | Remainder | 79.8 | 980 | 0.15 | Absence |
| 105 | 0.5 | 41.2 | Remainder | 79.8 | 980 | 0.3 | Absence |
| 106 | 0.5 | 41.2 | Remainder | 79.8 | 980 | 0.3 | Presence |
| 107 | 0.5 | 41.2 | Remainder | 79.8 | 980 | 0.3 | Presence |
| 108 | 0.5 | 41.2 | Remainder | 79.8 | 980 | 0.15 | Absence |
| 109 | — | — | — | — | — | 0.15 | Absence |
| 110 | — | — | — | — | — | 0.3 | Absence |
| 111 | — | — | — | — | — | 0.15 | Absence |
| 112 | — | — | — | — | — | 0.3 | Absence |

[Table 11]

TABLE 11

| | Base | | | | | Coating | | | |
|---|---|---|---|---|---|---|---|---|---|
| | Co content | TiCN content | CaCa content | TaC consent | WC content | Underlayer | | Intermediate layer | |
| Sample No. | rate [mass %] | rate [mass %] | rate [mass %] | rate [mass %] | rate [mass %] | Composition | Thickness | Composition | Thickness |
| 1 | 6.0 | 4.0 | 0.1 | 1.0 | Remainder | TiN | 1.0 | TiCN | 4.5 |
| 2 | 6.0 | 4.0 | 0.1 | 1.0 | Remainder | TiN | 1.0 | TiCN | 4.5 |
| 3 | 6.0 | 4.0 | 0.1 | 1.0 | Remainder | TiN | 1.0 | TiCN | 4.0 |
| 4 | 6.0 | 4.0 | 0.1 | 1.0 | Remainder | TiN | 1.0 | TiCN | 4.0 |
| 5 | 6.0 | 4.0 | 0.1 | 1.0 | Remainder | TiN | 1.1 | TiCN | 4.5 |
| 6 | 6.0 | 4.0 | 0.1 | 1.0 | Remainder | TiN | 1.2 | TiCN | 4.8 |
| 7 | 6.0 | 4.0 | 0.1 | 1.0 | Remainder | TiN | 1 | TiCN | 4.7 |
| 8 | 6.0 | 4.0 | 0.1 | 1.0 | Remainder | TiN | 0.9 | TiCN | 4.8 |
| 9 | 6.0 | 4.0 | 0.1 | 1.0 | Remainder | TiN | 1.1 | TiCN | 4.5 |
| 10 | 6.0 | 4.0 | 0.1 | 1.0 | Remainder | TiN | 0.9 | TiCN | 4.4 |
| 11 | 6.0 | 4.0 | 0.1 | 1.0 | Remainder | TiN | 1 | TiCN | 6.1 |
| 12 | 6.0 | 4.0 | 0.1 | 1.0 | Remainder | TiN | 0.9 | TiCN | 6.3 |
| 13 | 6.0 | 4.0 | 0.1 | 1.0 | Remainder | TiN | 1.2 | TiCN | 4.3 |
| 14 | 6.0 | 4.0 | 0.1 | 1.0 | Remainder | TiN | 0.9 | TiCN | 4.2 |
| 15 | 6.0 | 4.0 | 0.1 | 1.0 | Remainder | TiN | 1.2 | TiCN | 4.5 |
| 16 | 6.0 | 4.0 | 0.1 | 1.0 | Remainder | TiN | 1.1 | TiCN | 4.3 |
| 17 | 6.0 | 4.0 | 0.1 | 1.0 | Remainder | TiN | 1.0 | TiCN | 4.5 |
| 18 | 6.0 | 4.0 | 0.1 | 1.0 | Remainder | TiN | 1.0 | TiCN | 4.8 |

TABLE 11-continued

| | Base | | | | | Coating | | |
| | Co content | TiCN content | CaCa content | TaC consent | WC content | Underlayer | | Intermediate layer | |
| Sample No. | rate [mass %] | rate [mass %] | rate [mass %] | rate [mass %] | rate [mass %] | Composition | Thickness | Composition | Thickness |
|---|---|---|---|---|---|---|---|---|---|
| 19 | 6.0 | 4.0 | 0.1 | 1.0 | Remainder | TiN | 1.0 | TiCN | 4.5 |
| 20 | 6.0 | 4.0 | 0.1 | 1.0 | Remainder | TiN | 1.0 | TiCN | 4.5 |

[Table 12]

TABLE 12

| | Base | | | | | Coating | | |
| | Co content | TiCN content | CaCa content | TaC consent | WC content | Underlayer | | Intermediate layer | |
| Sample No | rate [mass %] | rate [mass %] | rate [mass %] | rate [mass %] | rate [mass %] | Composition | Thickness | Composition | Thickness |
|---|---|---|---|---|---|---|---|---|---|
| 101 | 6.0 | 4.0 | 0.1 | 1.0 | Remainder | TiN | 0.9 | TiCN | 4.3 |
| 102 | 6.0 | 4.0 | 0.1 | 1.0 | Remainder | TiN | 1.1 | TiCN | 4.4 |
| 103 | 6.6 | 4.0 | 0.1 | 10 | Remainder | TiN | 1.1 | TiCN | 4.6 |
| 104 | 6.0 | 4.0 | 0.1 | 1.0 | Remainder | TiN | 1.0 | TiCN | 4.2 |
| 106 | 6.0 | 4.0 | 0.1 | 1.0 | Remainder | TiN | 1.0 | TiCN | 4.2 |
| 106 | 6.0 | 4.0 | 0.1 | 1.0 | Remainder | TiN | 1.0 | TiCN | 4.4 |
| 107 | 6.0 | 4.0 | 0.1 | 1.0 | Remainder | TiN | 0.9 | TiCN | 4.1 |
| 108 | 6.0 | 4.0 | 0.1 | 1.0 | Remainder | TiN | 1.1 | TiCN | 4.2 |
| 109 | 6.0 | 4.0 | 0.1 | 1.0 | Remainder | TiN | 1.0 | TiCN | 4.4 |
| 110 | 6.0 | 4.0 | 0.1 | 1.0 | Remainder | TiN | 1.0 | TiCN | 4.4 |
| 111 | 6.0 | 4.0 | 0.1 | 1.0 | Remainder | TiN | 1.0 | TiCN | 4.4 |
| 112 | 6.0 | 4.0 | 0.1 | 1.0 | Remainder | TiN | 1.0 | TiCN | 4.4 |

[Table 13]

TABLE 13

| | Coating First layer | | | | | | |
| Sample No. | Composition | Thickness [μm] | Ra [μm] | N2/N1 | (N2/N1) − (N4/N3) | N5/N3 | TC (0012) |
|---|---|---|---|---|---|---|---|
| 1 | α-Al$_2$O$_3$ | 6.0 | 0.07 | 0.897 | 0.762 | 0.135 | 1 | 7.6 |
| 2 | α-Al$_2$O$_3$ | 6.0 | 0.08 | 0.897 | 0.762 | 0.135 | 1 | 7.6 |
| 3 | α-Al$_2$O$_3$ | 3.2 | 0.10 | 0.623 | 0.472 | 0.151 | 1 | 5.0 |
| 4 | α-Al$_2$O$_3$ | 3.2 | 0.10 | 0.623 | 0.472 | 0.151 | 1 | 5.0 |
| 5 | α-Al$_2$O$_3$ | 6.2 | 0.1 | 0.60 | 0.457 | 0.143 | 0.99 | 7.1 |
| 6 | α-Al$_2$O$_3$ | 6.1 | 0.05 | 1.00 | 0.887 | 0.113 | 1 | 7.8 |
| 7 | α-Al$_2$O$_3$ | 5.8 | 0.08 | 0.898 | 0.798 | 0.10 | 1 | 7.7 |
| 8 | α-Al$_2$O$_3$ | 6.1 | 0.09 | 0.687 | 0.257 | 0.40 | 0.99 | 6.9 |
| 9 | α-Al$_2$O$_3$ | 6.3 | 0.03 | 0.894 | 0.789 | 0.105 | 1 | 7.7 |
| 10 | α-Al$_2$O$_3$ | 6.4 | 0.2 | 0.887 | 0.786 | 0.101 | 1 | 7.2 |
| 11 | α-Al$_2$O$_3$ | 8.8 | 0.05 | 0.874 | 0.812 | 0.062 | 1 | 7.6 |
| 12 | α-Al$_2$O$_3$ | 9 | 0.2 | 0.866 | 0.786 | 0.079 | 1 | 7.3 |
| 13 | α-Al$_2$O$_3$ | 3.1 | 0.1 | 0.728 | 0.55 | 0.178 | 0.99 | 4.6 |
| 14 | α-Al$_2$O$_3$ | 2 | 0.1 | 0.723 | 0.572 | 0.151 | 0.99 | 5.9 |
| 15 | α-Al$_2$O$_3$ | 15 | 0.07 | 0.873 | 0.763 | 0.11 | 1 | 7.7 |
| 16 | α-Al$_2$O$_3$ | 6.3 | 0.09 | 0.881 | 0.724 | 0.157 | 0.97 | 7.3 |
| 17 | α-Al$_2$O$_3$ | 6.0 | 0.07 | 0.897 | 0.762 | 0.135 | 1 | 7.6 |
| 18 | α-Al$_2$O$_3$ | 6.0 | 0.08 | 0.887 | 0.762 | 0.135 | 1 | 7.6 |
| 19 | α-Al$_2$O$_3$ | 3.1 | 0.07 | 0.897 | 0.762 | 0.135 | 1 | 7.6 |
| 20 | α-Al$_2$O$_3$ | 3.1 | 0.08 | 0.897 | 0.762 | 0.135 | 1 | 7.6 |

[Table 14]

TABLE 14

| Sample No. | Coating First layer Composition | Thickness [μm] | Ra [μm] | N2/N1 | NA/N3 | (N2/N1) − (N4/N3) | N5/N3 | TC (0012) |
|---|---|---|---|---|---|---|---|---|
| 101 | α-Al$_2$O$_3$ | 5.9 | 0.09 | 0.885 | 0.421 | 0.464 | 0.85 | 7.7 |
| 102 | α-Al$_2$O$_3$ | 6.1 | 0.09 | 0.854 | 0.432 | 0.422 | 0.85 | 7.8 |
| 103 | α-Al$_2$O$_3$ | 6.0 | 0.12 | 0.842 | 0.864 | −0.022 | 1 | 7.8 |
| 104 | α-Al$_2$O$_3$ | 3.1 | 0.12 | 0.679 | 0.663 | 0.016 | 1 | 5.3 |
| 105 | α-Al$_2$O$_3$ | 8.1 | 0.12 | 0.679 | 0.663 | 0.016 | 1 | 6.3 |
| 106 | α-Al$_2$O$_3$ | 6.1 | 0.09 | 0.848 | 0.400 | 0.446 | 0.86 | 7.7 |
| 107 | α-Al$_2$O$_3$ | 3.0 | 0.09 | 0.683 | 0.234 | 0.449 | 0.86 | 5.3 |
| 108 | α-Al$_2$O$_3$ | 6.1 | 0.12 | 0.534 | 0.583 | −0.049 | 1 | 7.1 |
| 109 | α-Al$_2$O$_3$ | 6.1 | 0.12 | 0.846 | 0.400 | 0.446 | 0.86 | 7.7 |
| 110 | α-Al$_2$O$_3$ | 6.1 | 0.11 | 0.846 | 0.400 | 0.446 | 0.86 | 7.7 |
| 111 | α-Al$_2$O$_3$ | 3 | 0.12 | 0.846 | 0.400 | 0.446 | 0.88 | 7.7 |
| 112 | α-Al$_2$O$_3$ | 3 | 0.11 | 0.846 | 0.400 | 0.446 | 0.86 | 7.7 |

[Table 15]

TABLE 15

| Sample No. | Coating Surface layer Composition | Thickness [μm] | Thickness [μm] |
|---|---|---|---|
| 1 | TiN | 1.5 | 13 |
| 2 | TiN | 1.6 | 13.1 |
| 3 | TiN | 1.4 | 9.6 |
| 4 | TiN | 1.5 | 9.7 |
| 5 | TiN | 1.4 | 13.2 |
| 6 | TiN | 1.5 | 13.3 |
| 7 | TiN | 1.5 | 13 |
| 8 | TiN | 1.4 | 13.2 |
| 9 | TiN | 1.4 | 13.3 |
| 10 | TiN | 1.5 | 13.2 |
| 11 | TiN | 1.2 | 17.1 |
| 12 | TiN | 1.1 | 17.3 |
| 13 | TiN | 1.6 | 10.2 |
| 14 | TiN | 1.3 | 8.4 |
| 15 | TiN | 1.3 | 22 |
| 16 | TiN | 1.1 | 12.8 |
| 17 | — | — | 11.5 |
| 18 | — | — | 11.5 |
| 19 | — | — | 8.6 |
| 20 | — | — | 8.6 |

[Table 16]

TABLE 16

| Sample No. | Coating Surface layer Composition | Thickness [μm] | Thickness [μm] |
|---|---|---|---|
| 101 | TiN | 1.0 | 12.1 |
| 102 | TiN | 1.2 | 12.8 |
| 103 | TiN | 1.0 | 12.7 |
| 104 | TiN | 0.4 | 8.7 |
| 105 | TiN | 0.4 | 8.7 |
| 106 | TiN | 0.9 | 12.4 |
| 107 | TiN | 0.5 | 8.5 |
| 108 | TiN | 1 | 12.4 |
| 109 | — | — | 11.5 |

TABLE 16-continued

| Sample No. | Coating Surface layer Composition | Thickness [μm] | Thickness [μm] |
|---|---|---|---|
| 110 | — | — | 11.5 |
| 111 | — | — | 8.4 |
| 112 | — | — | 8.4 |

[Table 17]

TABLE 17

| Sample No. | Coating First layer Compressive residual stress [GPa] |
|---|---|
| 17 | 1.4 |
| 18 | 3.5 |
| 19 | 1.8 |
| 20 | 3.8 |
| 109 | 0.9 |
| 110 | cracking present |
| 111 | 1.3 |
| 112 | cracking present |

[Table 18]

TABLE 18

| Sample No. | Cutting test 1 [second] | Cutting test 2 [km] |
|---|---|---|
| 1 | 270 | 4.5 |
| 2 | 340 | 4.4 |
| 3 | 320 | 2.9 |
| 4 | 350 | 2.7 |
| 5 | 260 | 4.2 |
| 6 | 290 | 4.6 |
| 7 | 290 | 4.7 |
| 8 | 250 | 3.8 |
| 9 | 340 | 4.4 |
| 10 | 340 | 4.3 |
| 11 | 300 | 5.1 |
| 12 | 300 | 4.8 |

TABLE 18-continued

| Sample No. | Cutting test 1 [second] | Cutting test 2 [km] |
|---|---|---|
| 13 | 270 | 2.5 |
| 14 | 270 | 2.6 |
| 15 | 210 | 5.3 |
| 16 | 270 | 4.4 |
| 101 | 30 | 0.2 |
| 102 | 30 | 0.2 |
| 103 | 200 | 3.5 |
| 104 | 250 | 2.2 |
| 105 | 270 | 2.1 |
| 106 | 30 | 0.2 |
| 107 | 30 | 0.1 |
| 108 | 190 | 3.3 |

<<Characteristics Evaluation of Cutting Tool>>
<Composition of Underlayer>

A composition of the underlayer of the cutting tool according to each sample was determined by the method described in Embodiment 1. The obtained results are shown in the column "Composition" of the column "Underlayer" in Table 11 and Table 12. A case where a component name is described in the column "Composition" of the column "Underlayer" in Table 11 and Table 12 means that the underlayer is composed of the component described in the column "Composition" of the column "Underlayer" in Table 11 and Table 12.

<Composition of Intermediate Layer>

A composition of the intermediate layer of the cutting tool according to each sample was determined by the method described in Embodiment 1. The obtained results are described in the column "Composition" of the column "Intermediate layer" in Table 11 and Table 12. A case where a component name is described in the column "Composition" of the column "Intermediate layer" in Table 11 and Table 12 means that the surface layer is composed of the component described in the column "Composition" of the column "Intermediate layer" in Table 11 and Table 12.

<Composition of First Layer>

A composition of the first layer of the cutting tool according to each sample was determined by the method described in Embodiment 1. The obtained results are described in the column "Composition" of the column "First layer" in Table 13 and Table 14. A case where a component name is described in the column "Composition" of the column "First layer" in Table 13 and Table 14 means that the first layer is composed of the component described in the column "Composition" of the column "First layer" in Table 13 and Table 14.

<Surface Roughness Ra on Surface of First Layer or Surface Positioned on Interface on Surface Side of Coating of First Layer>

A surface roughness Ra on the surface of the first layer or the surface positioned on the interface, on the surface side of the coating, of the first layer was determined by the method described in Embodiment 1. The obtained results are described in the column "Ra [μm]" in Table 13 and Table 14.

<Ratio N2/N1, Ratio N4/N3, and Ratio N5/N3>

The ratio N2/N1 of the cutting tool according to each sample was determined by the method described in Embodiment 1. The obtained results are described in the column "N2/N1" in Table 13 and Table 14 The ratio N4/N3 of the cutting tool according to each sample was determined by the method described in Embodiment 1. The obtained results are described in the column "N4/N3" in Table 13 and Table 14. The ratio N5/N3 of the cutting tool according to each sample was determined by the method described in Embodiment 1. The obtained results are described in the column "N5/N3" in Table 13 and Table 14.

<Compressive Residual Stress of First Layer>

An absolute value of compressive residual stress of the first layer of the cutting tool according to Samples 17 to 20 and 109 to 112 was determined by the method described in Embodiment 1. The obtained results are described in the column "Compressive residual stress [GPa]" of the column "First layer" in Table 17. A case where "cracking present" is described in the column "Compressive residual stress [GPa]" of the column "First layer" in Table 17 means that the compressive residual stress is unmeasurable due to occurrence of cracking in the first layer.

<Orientation Index TC (0 0 12) of First Layer>

An orientation index TC (0 0 12) of the first layer of the cutting tool according to each sample was determined by the method described in Embodiment 1. The obtained results are shown in the column "TC (0012)" of the column "First layer" in Table 13 and Table 14.

<Composition of Surface Layer>

A composition of the surface layer of the cutting tool according to each sample was determined by the method described in Embodiment 1. The obtained results are described in the column "Composition" of the column "Surface layer" in Table 15 and Table 16. A case where a component name is described in the column "Composition" of the column "Surface layer" in Table 15 and Table 16 means that the surface layer is composed of the component described in the column "Composition" of the column "Surface layer" in Table 15 and Table 16.

<Thickness of Coating>

A thickness of the coating of the cutting tool according to each sample was determined by the method described in Embodiment 1. The obtained results are described in the column "Thickness [μm]" of the column "Coating" in Table 15 and Table 16.

<<Cutting Test 1>>

A cutting test was performed by using the cutting tool according to each sample under the following cutting conditions. A cutting time until chipping occurred was measured. The obtained results are described in the column "Cutting test 1 [sec]" in Table 18.

(Cutting Condition)
Workpiece: FCD450
Processing intermittent turning
Cutting rate: 450 m/min
Feeding rate: 0.3 mm/rev
Cutting depth: 1.5 mm
Cutting liquid: wet <<Cutting Test 2>>

A cutting test was performed by using the cutting tool according to each sample under the following cutting conditions. A cutting distance until wearing on the flank face reached 0.2 mm was measured. The obtained results are described in the column "Cutting test 2 [km]" in Table 18.

(Cutting Condition)
Workpiece: FCD700
Processing: continuous turning
Cutting rate: 140 m/min
Feeding rate: 0.3 mm/rev
Cutting depth: 1.5 mm
Cutting liquid: wet A case where the cutting time is 210 seconds or more in the cutting test 1 and where the cutting distance is 2.5 km or more in the cutting test 2 means that the cutting tool has excellent tool lifetime.

Although not shown in Table 18, Samples 17 to 20 were confirmed to exhibit the cutting time of 210 seconds or more in the cutting test 1 and the cutting distance of 2.5 km in the cutting test 2. Although not shown in Table 18, Samples 109 to 112 were confirmed to fail to achieve at least one of the cutting time of 210 seconds or more in the cutting test 1 and the cutting distance of 2.5 km in the cutting test 2.

The cutting tools according to Samples 1 to 20 correspond to Examples. The cutting tools according to Samples 101 to 112 correspond to Comparative Examples. From the results of the cutting test 1 and the results of the cutting test 2 in Table 18, it was found that the cutting tools according to Samples 1 to 20 had excellent tool lifetime compared with the cutting tools according to Samples 101 to 112.

As above, it has been found that the cutting tools according to Samples 1 to 20 have excellent tool lifetime.

Although the embodiments and Examples of the present disclosure have been described as above, it is previously anticipated that the constituents of each of the aforementioned embodiments and Examples are appropriately combined or variously modified.

The disclosed embodiments and Examples herein are examples in all points, and should be non-limitative. The scope of the present invention is determined by not the above embodiments nor Examples but claims, and intended to include meaning equivalent to claims and all modification within the scope.

REFERENCE SIGNS LIST

1 Base; 2 Coating; 3 First layer; 4 Underlayer; 10 Cutting tool; 50 CVD apparatus; 52 Base-setting tool; 53 Reaction container; 54 Temperature regulating apparatus; 55, 57 Introducing port; 56 Nozzle; 59 Gas-discharging tube; 60 Gas-discharging port; 61 First injecting hole; 62 Second injecting hole.

The invention claimed is:

1. A cutting tool, comprising:
a base; and
a coating disposed on the base, wherein
the coating includes a first layer, wherein
the first layer is composed of $\alpha$-$Al_2O_3$,
a thickness of the first layer is 2 µm or more and 15 µm or less,
on a cross section along a normal line of an interface between the base and the coating, a ratio N2/N1 is 0.60 or more, wherein the ratio N2/N1 is a ratio of: a number N2 of second grain boundaries that are grain boundaries with an absolute value of an angle relative to a straight line perpendicular to an imaginary line L1 of 15° or less at a position where a first grain boundary and imaginary line L1 intersect in the first grain boundaries; relative to a number N1 of the first grain boundaries through which imaginary line L1 crosses, wherein imaginary line L1 has the same distances from a surface of the first layer or an interface, on a surface side of the coating, of the first layer and from an interface, on a side of the base, of the first layer, and
on the cross section along the normal line of the interface between the base and the coating, a ratio N4/N3 and the ratio N2/N1 satisfy a relationship of a following Formula 1, wherein the ratio N4/N3 is a ratio of: a number N4 of fourth grain boundaries that are grain boundaries with an absolute value of an angle relative to a straight line perpendicular to an imaginary line L2 of 15° or less at a position where a third grain boundary and imaginary line L2 intersect in the third grain boundaries; relative to a number N3 of the third grain boundaries through which imaginary line L2 crosses, wherein imaginary line L2 has a distance of 0.5 µm from the surface of the first layer or the interface, on the surface side of the coating, of the first layer toward a side of the base, $$0.1 \leq (N2/N1) - (N4/N3) \leq 0.40 \qquad \text{Formula 1.}$$

2. The cutting tool according to claim 1, wherein the number N3 and a number N5 of fifth grain boundaries that are grain boundaries with an absolute value of an angle relative to a straight line perpendicular to imaginary line L2 of 45° or less at a position where the third grain boundary and imaginary line L2 intersect in the third grain boundaries satisfy a relationship of a following Formula 2, $$(N5/N3) > 0.96 \qquad \text{Formula 2.}$$

3. The cutting tool according to claim 1, wherein
the thickness of the first layer is less than 8 µm, and
on the surface of the first layer or on a surface positioned on an interface, on the surface side of the coating, of the first layer, a surface roughness Ra is 0.03 µm or more and 0.2 µm or less.

4. The cutting tool according to claim 1, wherein
the thickness of the first layer is 8 µm or more, and
on the surface of the first layer or on a surface positioned on an interface, on the surface side of the coating, of the first layer, a surface roughness Ra is 0.05 µm or more and 0.2 µm or less.

5. The cutting tool according to claim 1, wherein an absolute value of a compressive residual stress of the first layer is 1.5 GPa or more and 4.0 GPa or less.

6. The cutting tool according to claim 1, wherein an orientation index TC (0 0 12) of the first layer is more than 4.5.

* * * * *